United States Patent
Lin et al.

(10) Patent No.: US 12,408,419 B2
(45) Date of Patent: Sep. 2, 2025

(54) SEMICONDUCTOR DEVICE AND METHOD FOR FORMING CAPACITOR STRUCTURE

(71) Applicant: Taiwan Semiconductor Manufacturing Co., Ltd., Hsinchu (TW)

(72) Inventors: Meng-Han Lin, Hsinchu (TW); Sai-Hooi Yeong, Zhubei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 546 days.

(21) Appl. No.: 17/647,046

(22) Filed: Jan. 5, 2022

(65) Prior Publication Data
US 2022/0392889 A1    Dec. 8, 2022

Related U.S. Application Data

(60) Provisional application No. 63/196,971, filed on Jun. 4, 2021.

(51) Int. Cl.
*H10D 84/80* (2025.01)
*H10B 12/00* (2023.01)
(Continued)

(52) U.S. Cl.
CPC ........... *H10D 84/811* (2025.01); *H10D 1/692* (2025.01); *H10D 30/024* (2025.01); *H10D 30/6211* (2025.01); *H10D 64/017* (2025.01)

(58) Field of Classification Search
CPC .............. H01L 27/0629; H01L 28/60; H01L 29/66545; H01L 29/66795; H01L 29/7851;
(Continued)

(56) References Cited

U.S. PATENT DOCUMENTS 8,022,458 B2   9/2011  Chang et al.
2008/0173978 A1   7/2008  Tu
(Continued)

FOREIGN PATENT DOCUMENTS

TW    201906178 A    2/2019

*Primary Examiner* — Herve-Louis Y Assouman
(74) *Attorney, Agent, or Firm* — Slater Matsil, LLP

(57) ABSTRACT

A semiconductor device includes a first device over a substrate, wherein the first device includes a gate stack including a gate electrode material; a source/drain region in the substrate adjacent the gate stack; a first isolation region surrounding the gate stack; a gate contact over and contacting the gate stack, wherein the gate contact includes a gate contact material; and a second isolation region surrounding the gate contact; and a second device over the substrate, wherein the second device includes a first parallel capacitor including first electrodes, wherein the first electrodes include the gate electrode material, wherein the first isolation region separates the first electrodes; and a second parallel capacitor over the first parallel capacitor, wherein the second parallel capacitor includes second electrodes connected to the first electrodes, wherein the second electrodes include the gate contact material, wherein adjacent second electrodes are separated by the second isolation region.

20 Claims, 42 Drawing Sheets

(51) Int. Cl.
   *H10D 1/68*       (2025.01)
   *H10D 30/01*      (2025.01)
   *H10D 30/62*      (2025.01)
   *H10D 30/69*      (2025.01)
   *H10D 62/822*     (2025.01)
   *H10D 64/01*      (2025.01)
   *H10D 84/01*      (2025.01)
   *H10D 84/03*      (2025.01)
   *H10D 84/83*      (2025.01)

(58) Field of Classification Search
   CPC ......... H01L 21/823431; H01L 27/0886; H01L 29/165; H01L 29/6656; H01L 29/7848; H10B 12/36; H10B 12/03; H10B 12/056
   See application file for complete search history.

(56) References Cited

U.S. PATENT DOCUMENTS

| | | | |
|---|---|---|---|
| 2008/0230820 A1* | 9/2008 | Maeda | H01L 29/94 257/E29.345 |
| 2009/0020800 A1* | 1/2009 | Tempel | H01L 29/66825 257/E21.409 |
| 2009/0090951 A1* | 4/2009 | Chang | H01L 23/5223 257/306 |
| 2009/0121322 A1* | 5/2009 | Ozawa | H01L 23/3171 438/622 |
| 2010/0078695 A1* | 4/2010 | Law | H01L 23/5223 257/296 |
| 2012/0132997 A1* | 5/2012 | Tokita | H01L 29/6656 257/E21.423 |
| 2012/0299115 A1 | 11/2012 | Chuang et al. | |
| 2014/0225225 A1* | 8/2014 | Chung | H01L 28/90 257/532 |
| 2014/0239363 A1* | 8/2014 | Pan | H01L 23/5226 257/306 |
| 2016/0005731 A1 | 1/2016 | Chen | |
| 2016/0190242 A1* | 6/2016 | Ching | H01L 29/785 257/401 |
| 2017/0053930 A1* | 2/2017 | Prinz | H01L 28/00 |
| 2019/0006458 A1* | 1/2019 | Chan | H01L 21/76224 |
| 2019/0312028 A1 | 10/2019 | Park et al. | |
| 2020/0365595 A1* | 11/2020 | Sukekawa | H10B 12/31 |
| 2022/0208957 A1 | 6/2022 | Chan et al. | |

* cited by examiner

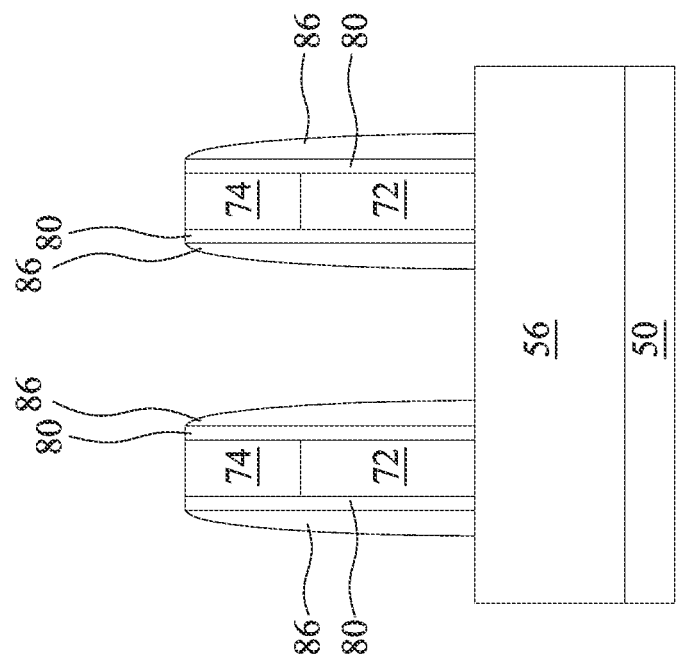
Fig. 10B
Fig. 10A

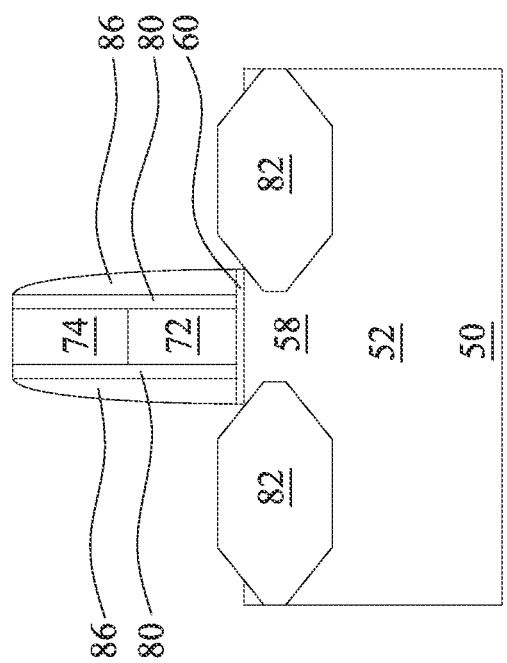
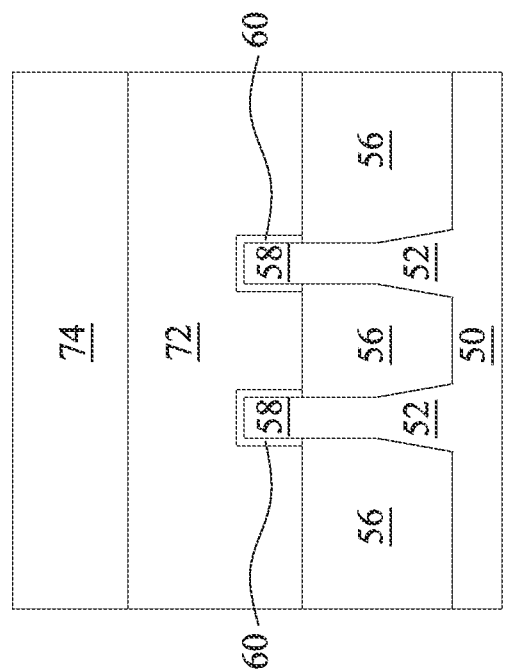
Fig. 11D
Fig. 11C

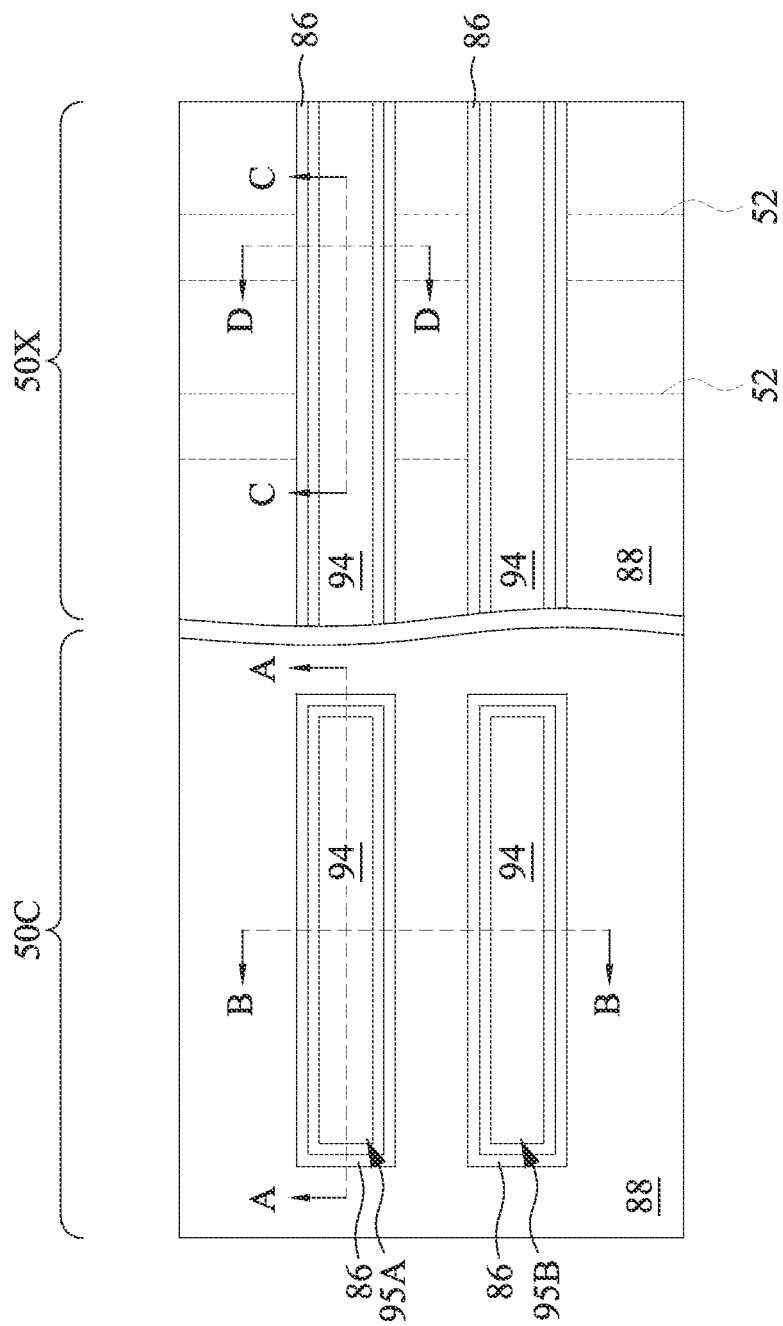

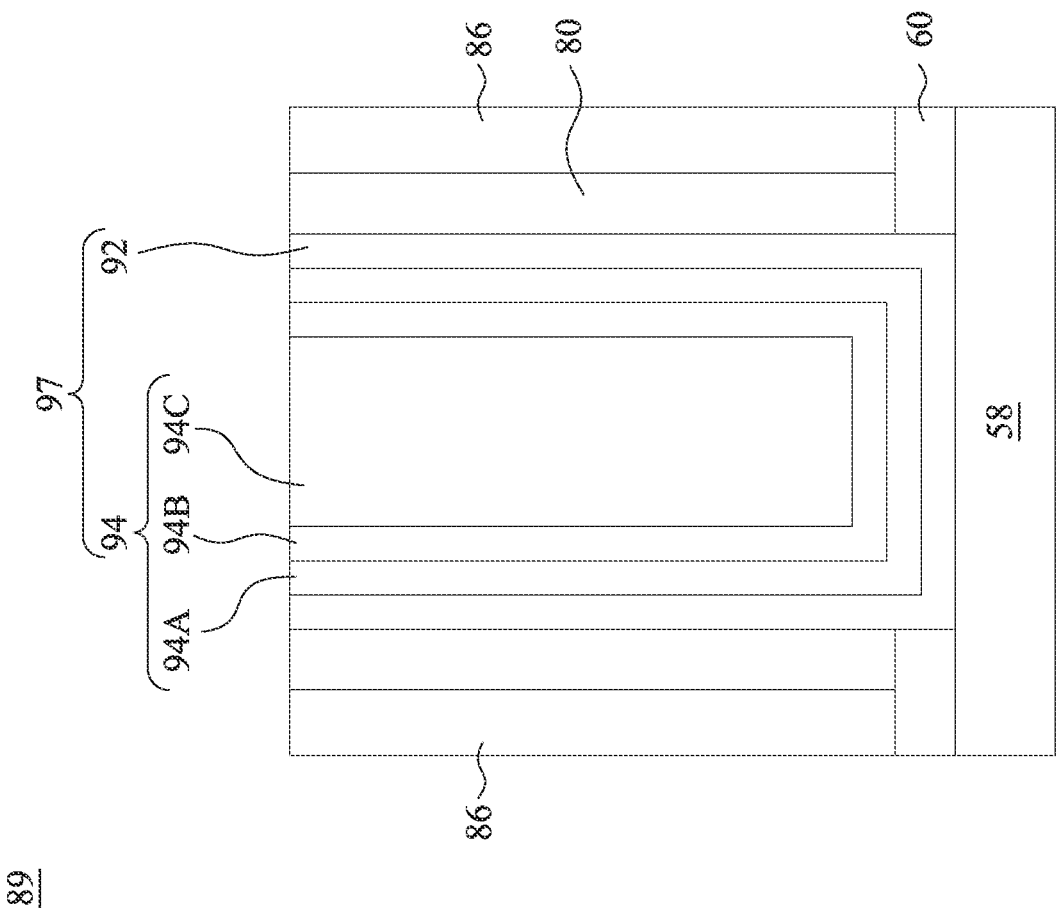

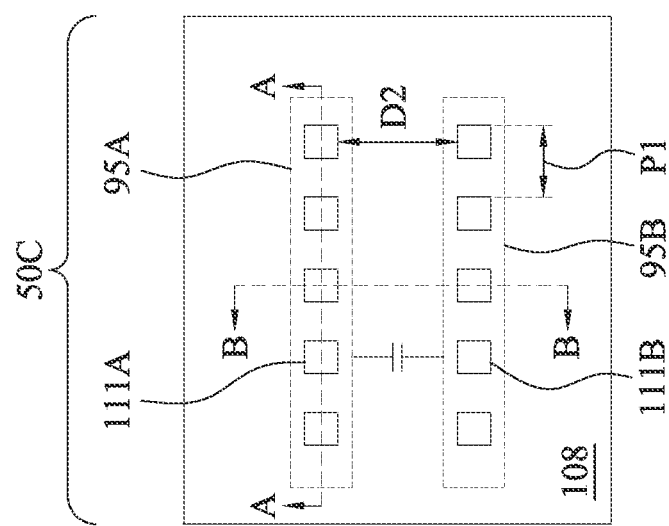

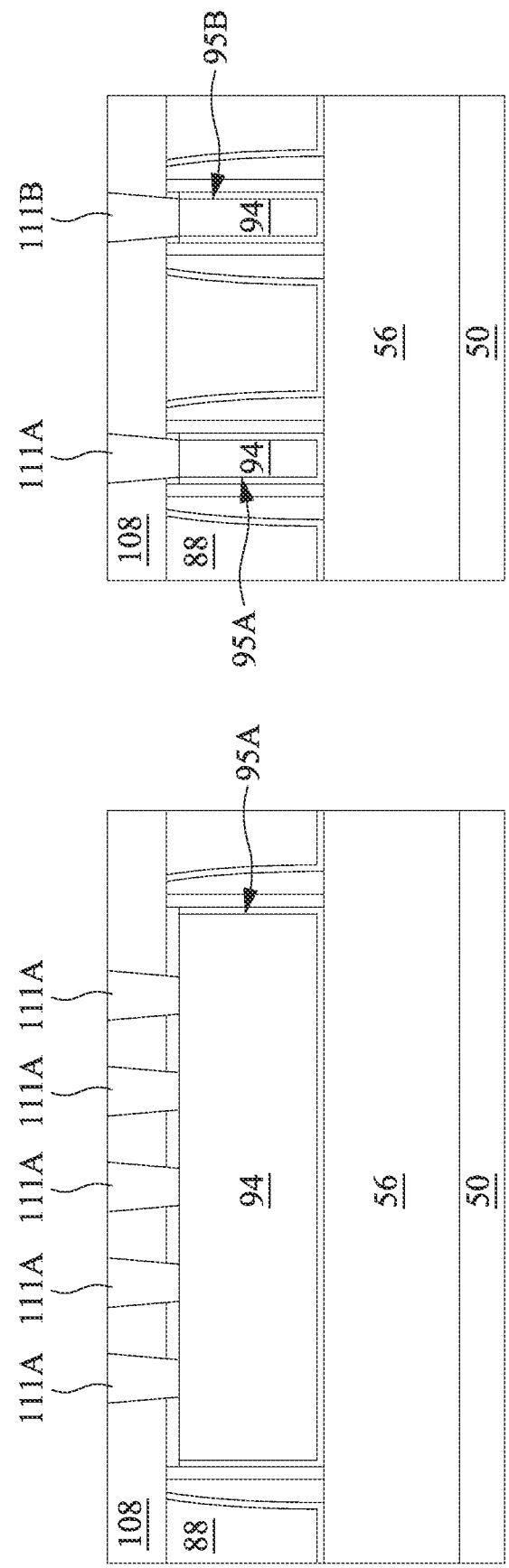

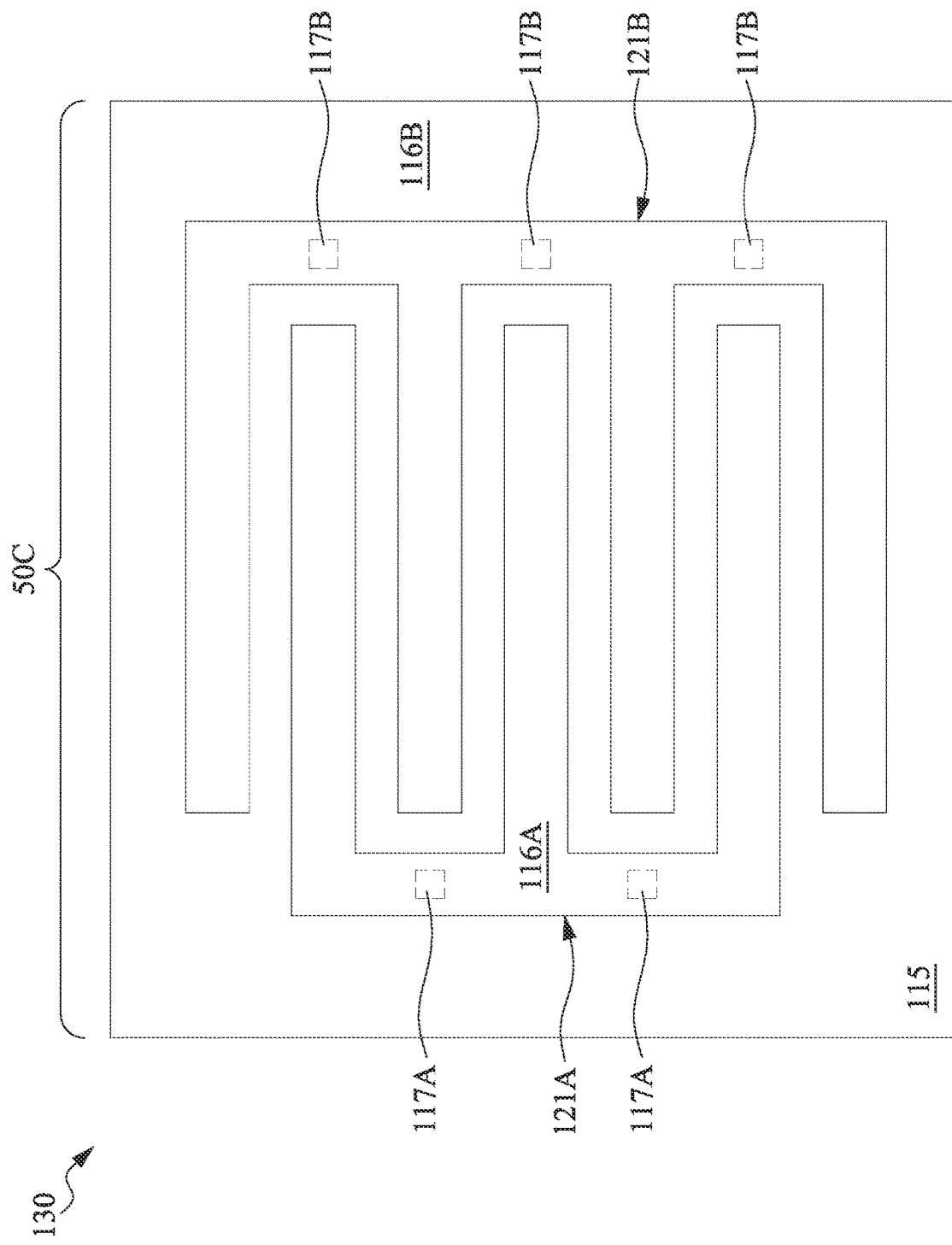

SEMICONDUCTOR DEVICE AND METHOD FOR FORMING CAPACITOR STRUCTURE

PRIORITY CLAIM AND CROSS-REFERENCE

This application claims the benefit of U.S. Provisional Application No. 63/196,971, filed on Jun. 4, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9A, 9B, 9C, 9D, 10A, 10B, 10C, 10D, 11A, 11B, 11C, 11D, 11E, 11F, 12A, 12B, 12C, 12D, 13, 14A, 14B, 14C, 14D, 15, 16A, 16B, 16C, 16D, 17, 18A, 18B, 18C, 18D, 18E, 19A, 19B, 19C, 19D, 20, 21A, 21B, 21C, 21D, 22A, 22B, 23, 24A, 24B, 25, 26A, and 26B are various views of intermediate stages in the manufacturing of a capacitor structure and a FinFET structure, in accordance with some embodiments.

FIGS. 29 and 30 are plan views of intermediate stages in the manufacturing of an interdigitated capacitor structure, in accordance with some embodiments.

DETAILED DESCRIPTION

Figure 1:
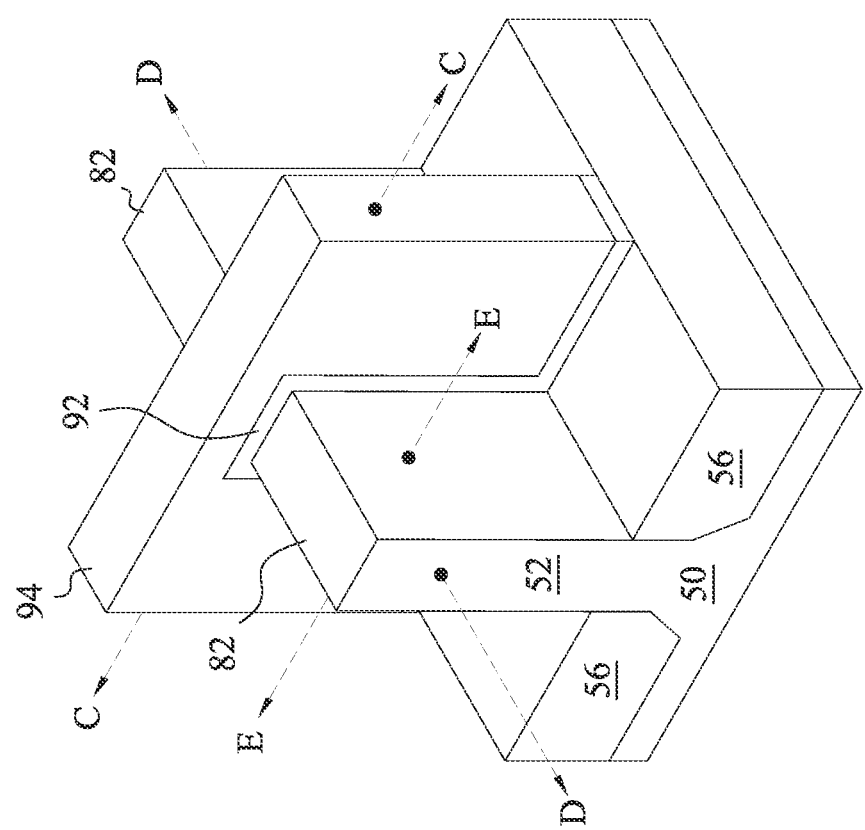
FIG. 1 illustrates an example of a FinFET structure in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments describe processes for forming a capacitor structure. The capacitor structure may be, for example, a Metal-Insulator-Metal (MIM) capacitor, a Metal-Oxide-Metal (MOM) capacitor, a Finger Metal-Oxide-Metal (FMOM) capacitor, or the like. The capacitor structure described herein includes bottom electrodes formed simultaneously with the gate electrode of a transistor and formed using the same processes that form the gate electrode of the transistor. In this manner, additional electrodes of a capacitor structure may be formed to increase capacitance without additional processing steps. Contacts to the bottom electrodes may be formed that also provide additional capacitance. The electrode contacts may be formed simultaneously with the gate contacts and/or source/drain contacts of the transistor, and formed using the same processes that form the gate contacts and/or source/drain contacts of the transistor. In this manner, the capacitance of a capacitor structure may be increased without additional processing steps. The techniques described herein may include processes suitable for forming n-type transistors and/or p-type transistors, and may be applicable to different kinds of transistors.

FIGS. 1 through 27 are various views of intermediate stages in the manufacturing of a capacitor structure 120 (see FIGS. 26A-26B) and a fin field-effect transistor (FinFET) structure 119 (see FIGS. 21C-21D), in accordance with some embodiments. In some embodiments, the capacitor structure 120 and the FinFET structure 119 are formed simultaneously on the same substrate 50, and are formed using at least some of the same process steps. In some embodiments, the capacitor structure 120 and the FinFET structure 119 are formed entirely using the same process steps. In this manner, a capacitor structure 120 may be formed without the use of additional process steps or masks, which can reduce the manufacturing cost of a device.

Some embodiments discussed herein are discussed in the context of transistors (e.g., FinFETs or planar FETs) formed using a gate-last process. In other embodiments, a gate-first process may be used. Also, some embodiments contemplate aspects used in other devices, such as nanostructure (e.g., nanosheet, nanowire, gate-all-around, or the like) field effect transistors (NSFETs), or the like.

Turning first to FIG. 1, an example of a FinFET in a three-dimensional view is shown, in accordance with some embodiments. The FinFET shown in FIG. 1 is an example structured used as a reference for the subsequent discussion of the process steps used in the manufacturing of the FinFET structure 119 (see FIGS. 21C-21D). The FinFET shown in FIG. 1 comprises a fin 52 on a substrate 50 (e.g., a semiconductor substrate). Isolation regions 56 are disposed in the substrate 50, and the fin 52 protrudes above and from between neighboring isolation regions 56 (e.g., Shallow Trench Isolation (STI) regions 56). Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and gate electrode layers 94 are over the gate dielectric layer 92. Source/drain regions 82 are disposed in opposite sides of the fin 52 with respect to the gate dielectric layer 92 and gate electrode layers 94. FIG. 1 further illustrates reference cross-sections that are used in later figures. Cross-section C-C is along a longitudinal axis of the gate electrode layers 94 and in a direction, for example, perpendicular to the direction of current flow between the source/drain regions 82 of the FinFET. Cross-section D-D is perpendicular to cross-section C-C and is along a longitudinal axis of the fin 52 and in a direction of, for example, a current flow between the source/drain regions 82 of the FinFET. Cross-section E-E is parallel to cross-section C-C and extends through a source/drain region 82 of the FinFET. Subsequent figures refer to these reference cross-sections for clarity.

Figure 3:
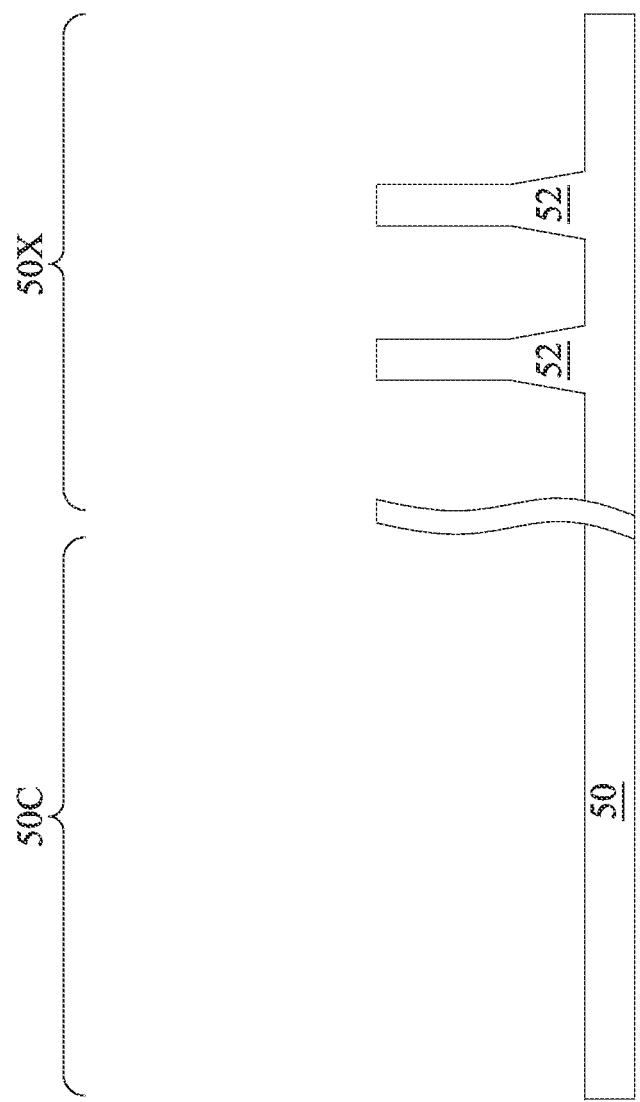
Figure 4:
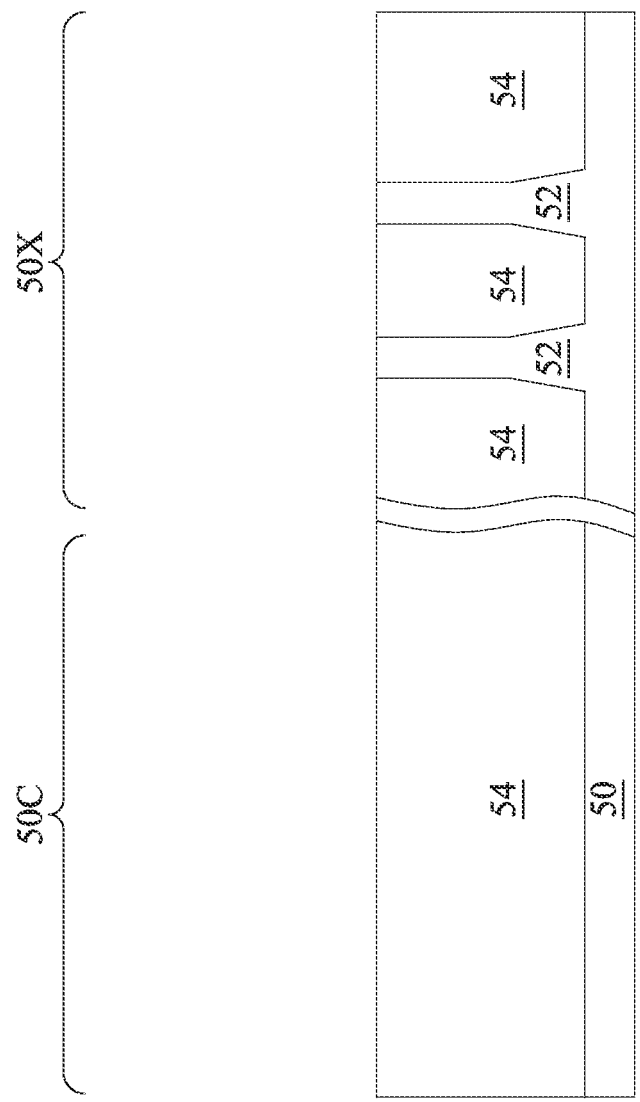
Figure 5:
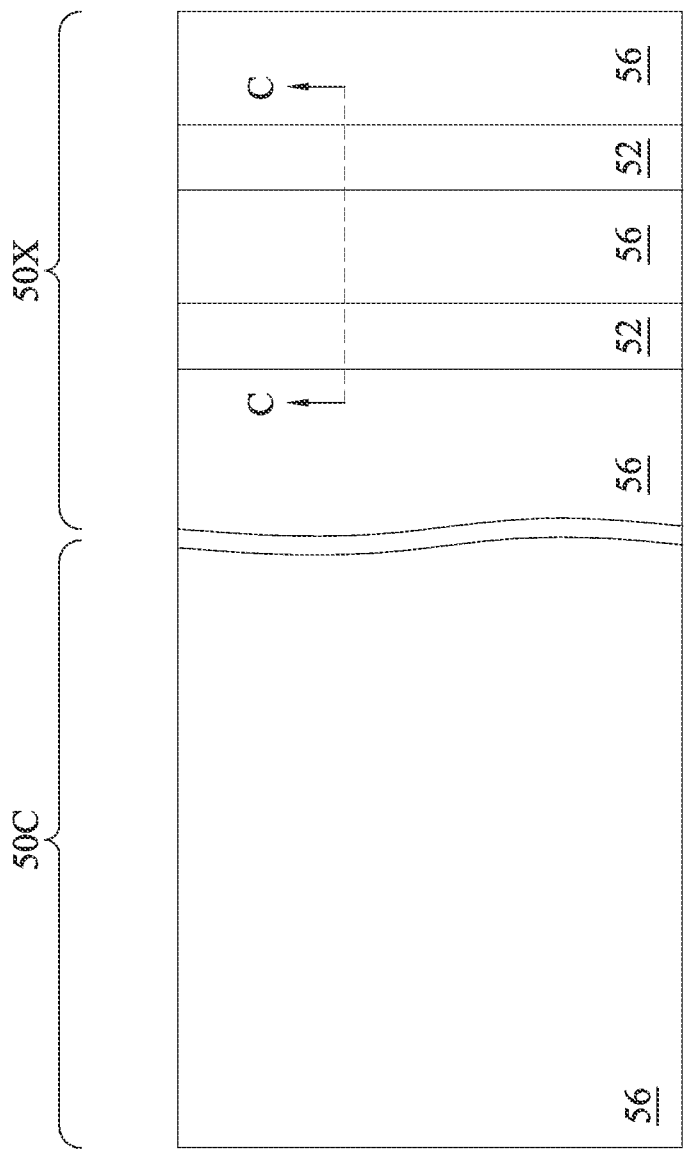

FIGS. 2 through 7 are various views of intermediate stages in the manufacturing of a capacitor structure 120 and a FinFET structure 119, in accordance with some embodiments. FIGS. 2, 3, 4, 6, and 7 illustrate the transistor region 50X along the reference cross-section C-C illustrated in FIG. 1, except for multiple fins/FinFETs. FIG. 5 illustrates a plan view of the capacitor region 50C and the transistor region 50X.

Figure 2:
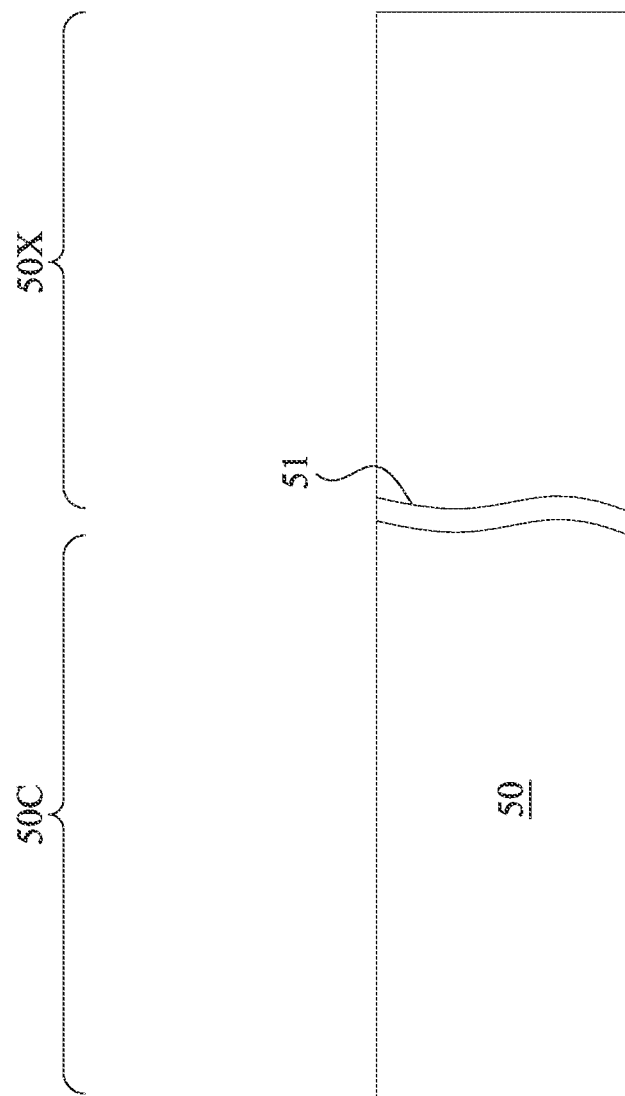

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; the like; or combinations thereof.

The substrate 50 is shown having a capacitor region 50C and a transistor region 50X, in accordance with some embodiments. The capacitor region 50C is a region in which one or more capacitor structures 120 are formed, and the transistor region 50X is a region in which one or more transistors such as FinFET structures 119 are formed. A single capacitor region 50C and a single transistor region 50X are shown in the figures, but a substrate may have any suitable number of capacitor regions 50C or transistor regions 50X of any suitable sizes. Other types of devices or structures than capacitors may be formed in the capacitor region 50C, and other types of devices or structures than transistors may be formed in the transistor region 50X. The capacitor region 50C may be physically separated from the transistor region 50X (as illustrated by divider 51), and any number of device features (e.g., other active devices, doped regions, isolation structures, etc.) may be disposed between the capacitor region 50C and the transistor region 50X. Further, the transistor region 50X may comprise an n-type region for forming n-type devices, a p-type region for forming p-type devices, or both an n-type region and a p-type region. The n-type region and the p-type region of the transistor region 50X may be referred to herein as "type regions."

In FIG. 3, fins 52 are formed in the substrate 50 in the transistor region 50X, in accordance with some embodiments. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. In some embodiments, the etch also etches the substrate 50 in the capacitor region 50C, as shown in FIG. 3.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

In FIG. 4, an insulation material 54 is formed over the substrate 50 and between neighboring fins 52 in the transistor region 50X, in accordance with some embodiments. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Still referring to FIG. 4, a removal process may be applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete. As shown in FIG. 4, the top surfaces of the insulation material 54 in the capacitor region 50C and in the transistor region 50X may be approximately level after performing the planarization process.

Figure 6:
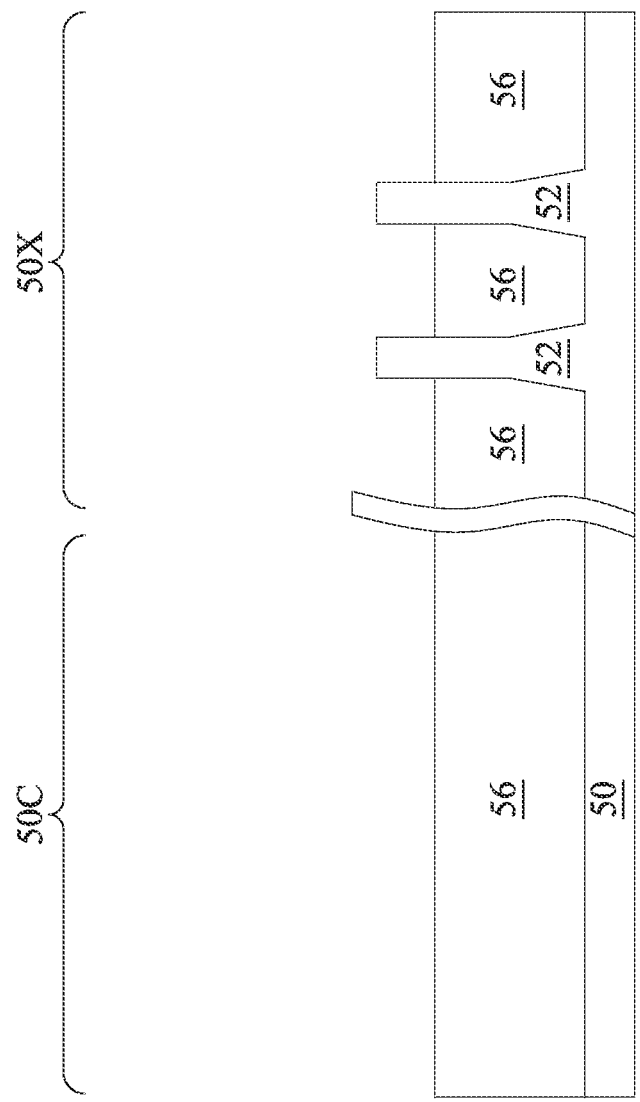

In FIGS. 5 and 6, the insulation material 54 is recessed to form Shallow Trench Isolation (STI) regions 56, in accordance with some embodiments. FIG. 5 illustrates a plan view of the capacitor region 50C and the transistor region 50X. FIG. 6 illustrates a cross-sectional view through the reference cross-section C-C shown in FIG. 5. The insulation material 54 is recessed such that upper portions of fins 52 in the transistor region 50X protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal process using dilute hydrofluoric acid (dHF) may be used, though other processes are possible.

The process described with respect to FIGS. 2 through 6 is just one example of how the fins 52 in the transistor region 50X may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 6 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in an n-type region of the transistor region 50X that is different from the material in a p-type region of the transistor region 50X. In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region of the transistor region 50X, and an N well may be formed in the p-type region of the transistor region 50X. In some embodiments, a P well or an N well is formed in both the n-type region and the p-type region of the transistor region 50X. A P well and/or an N well may be formed in the capacitor region 50C, in some embodiments.

In the embodiments with different well types, the different implant steps for the n-type region and the p-type region of the transistor region 50X may be achieved using a photoresist and/or other masks (not shown). For example, a photoresist may be formed over the fins 52 and the STI regions 56 in the n-type region. The photoresist is patterned to expose the p-type region of the transistor region 50X. The photoresist can be formed by using a spin-on technique and can be patterned using acceptable photolithography techniques. Once the photoresist is patterned, the n-type impurity implant is performed in the p-type region, and the photoresist may act as a mask to substantially prevent n-type impurities from being implanted into the n-type region. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region, a photoresist is formed over the fins 52 and the STI regions 56 in the p-type region. The photoresist is patterned to expose the n-type region of the transistor region 50X. The photoresist can be formed by using a spin-on technique and can be patterned using acceptable photolithography techniques. Once the photoresist is patterned, a p-type impurity implant may be performed in the n-type region, and the photoresist may act as a mask to substantially prevent p-type impurities from being implanted into the p-type region. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region and the p-type region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
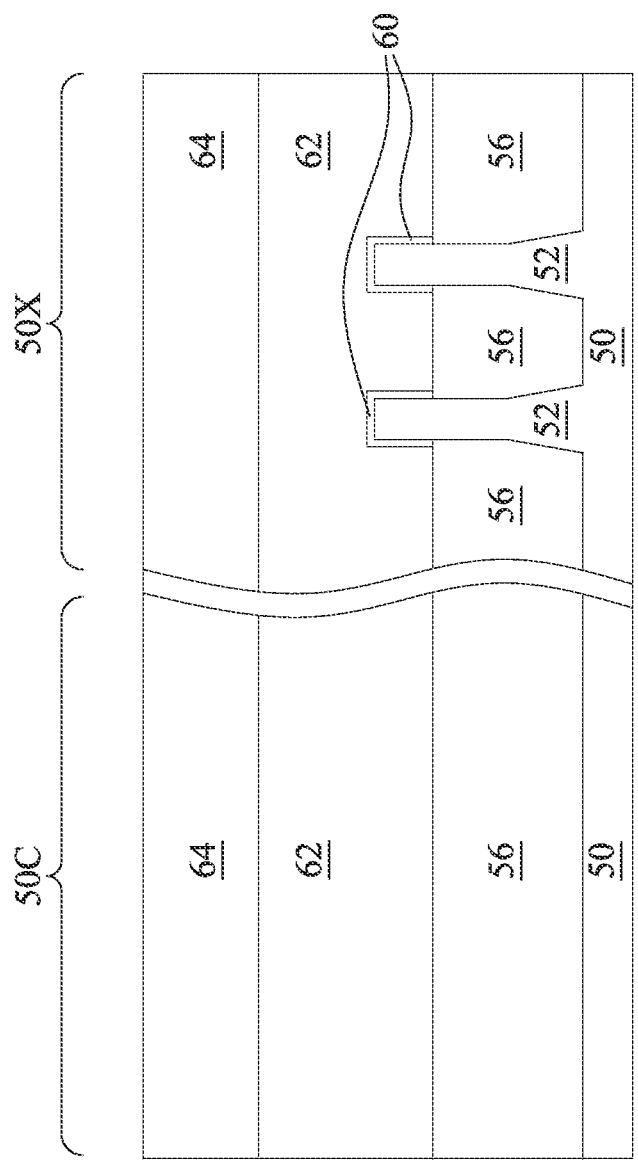

In FIG. 7, a dummy dielectric layer 60 is formed on the fins 52 in the transistor region 50X, in accordance with some embodiments. FIG. 7 is illustrated along the same cross-section C-C as FIG. 6. The dummy dielectric layer 60 may be, for example, silicon oxide, silicon nitride, a combination thereof, or the like, and may be deposited or thermally grown according to acceptable techniques. A dummy gate layer 62 is formed over the capacitor region 50C and the transistor region 50X, including over the dummy dielectric layer 60. A mask layer 64 is then formed over the dummy gate layer 62, in some embodiments. The dummy gate layer 62 may be deposited and then planarized, such as by a CMP or the like. The mask layer 64 may then be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the capacitor region 50C and the transistor region 50X. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions 56 and between the dummy gate layer 62 and the STI regions 56.

FIGS. 8 through 27 illustrate various additional steps in the manufacturing of embodiment devices. The structures illustrated in the transistor region 50X may be applicable to both an n-type region and a p-type region. Differences (if any) in the structures of an n-type region and a p-type region of the transistor region 50X are described in the text accompanying each figure.

FIGS. 8 through 21D illustrate plan views or cross-sectional views of features in the capacitor region 50C and/or the transistor region 50X. FIGS. 8, 13, 15, and 17 are plan views of the capacitor region 50C and the transistor region 50X, with cross-sections A-A and B-B indicated in the capacitor region 50C and cross-sections C-C and D-D indicated in the transistor region 50X. The cross-sections C-C and D-D correspond to the cross-sections C-C and D-D shown in FIG. 1. Cross-section A-A is parallel to cross-section C-C, cross-section B-B is parallel to cross-section D-D, and cross-sections A-A and C-C are perpendicular to cross-sections B-B and D-D. The cross-section A-A may or may not be aligned with cross-section C-C, and the cross-section B-B may or may not be aligned with cross-section D-D.

Figure 8:
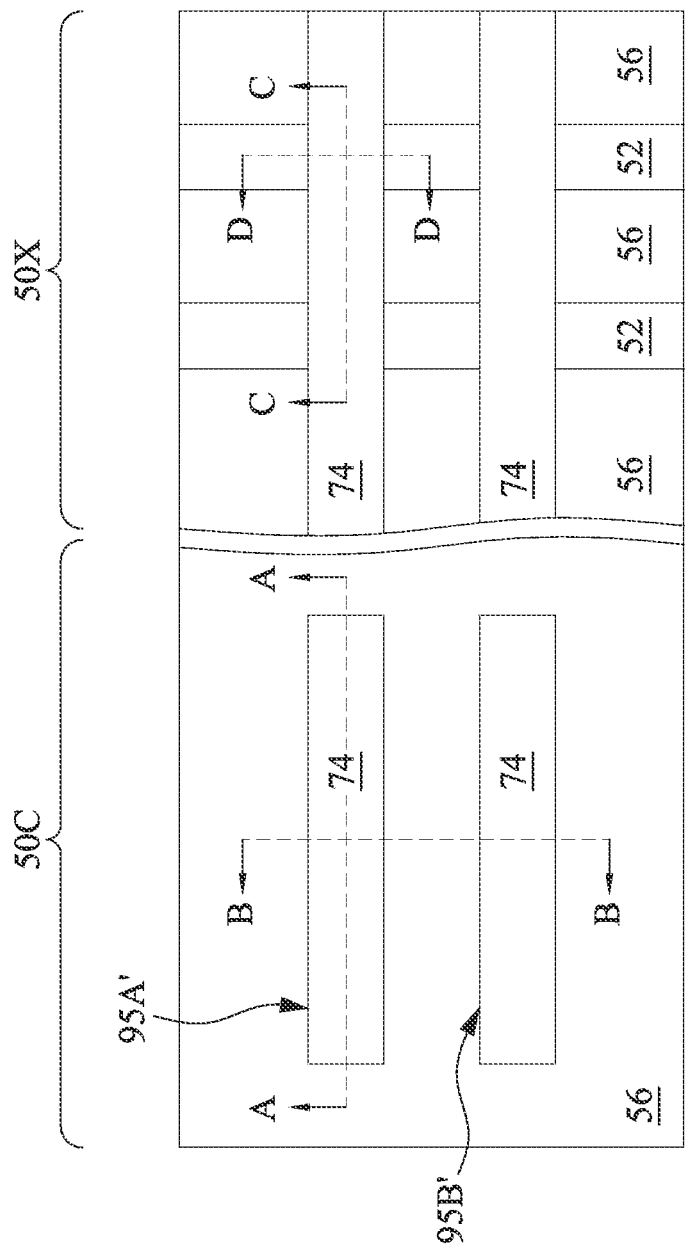

FIGS. 9A, 10A, 11A, 12A, 14A, 16A, 18A, 19A, and 21A are cross-sectional views of the capacitor region 50C along cross-section A-A (e.g., as shown in FIG. 8). FIGS. 9B, 10B, 11B, 12B, 14B, 16B, 18B, 19B, and 21B are cross-sectional views of the capacitor region 50C along cross-section B-B. FIGS. 9C, 10C, 11C, 12C, 14C, 16C, 18C, and 19C are cross-sectional views of the transistor region 50X along cross-section C-C. FIGS. 9D, 10D, 11D, 12D, 14D, 16D, 18D, and 19D are cross-sectional views of the transistor region 50X along cross-section D-D.

In FIGS. 8 and 9A-9D, the mask layer 64 is patterned to form masks 74, and the dummy gate layer 62 is patterned to form dummy gates 72, in accordance with some embodiments. As stated previously, FIG. 8 illustrates a plan view and FIGS. 9A-9D illustrate corresponding cross-sectional views. The mask layer 64 (see FIG. 7) may be patterned using acceptable photolithography and etching techniques to form masks 74. The pattern of the masks 74 then may be transferred to the dummy gate layer 62 to form dummy gates 72. In some embodiments (not illustrated), the pattern of the masks 74 may also be transferred to the dummy dielectric layer 60 by an acceptable etching technique to form dummy gates 72. The dummy gates 72 extend over the STI regions 56 in the capacitor region 50C, and cover respective channel regions 58 of the fins 52 in the transistor region 50X. The pattern of the masks 74 may be used to physically separate each of the dummy gates 72 from adjacent dummy gates 72.

In some embodiments, the dummy gates 72 in the capacitor region 50C are patterned to form two separated structures corresponding to two bottom electrodes of a capacitor structure. For example, the dummy gates 72 shown in FIGS. 8 and 9A-9B have been patterned to form a first dummy bottom electrode 95A' and a second dummy bottom electrode 95B'. The first dummy bottom electrode 95A' and the second dummy bottom electrode 95B' are subsequently processed to form a first bottom electrode 95A and a second bottom electrode 95B (see FIGS. 17 and 18A-18B) of a capacitor structure 120 (see FIGS. 26A-26B and 27).

Figure 9B:
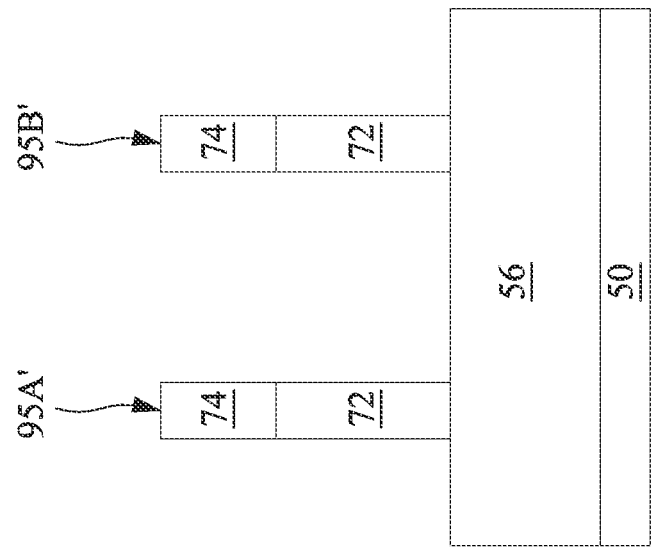
Figure 9A:
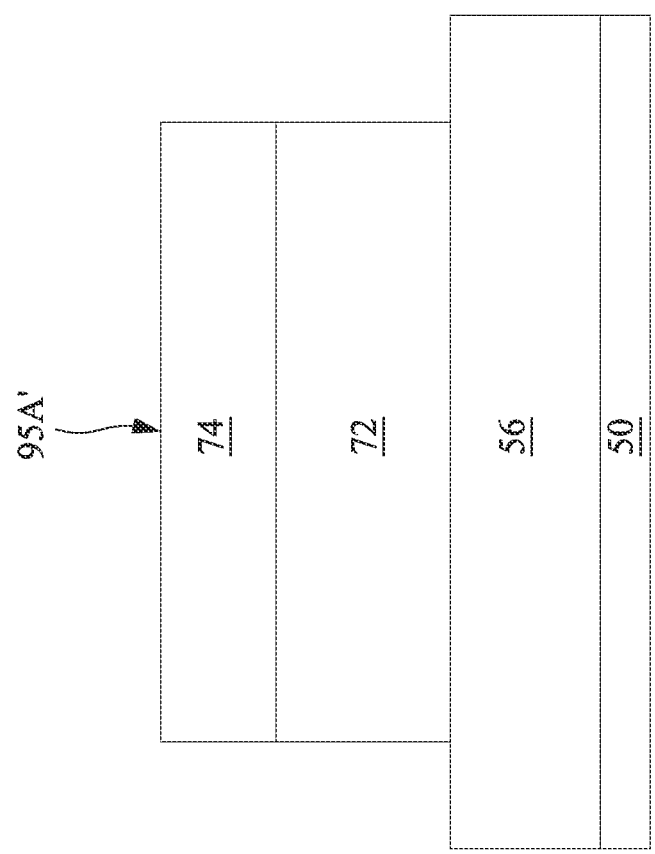
Figure 9D:
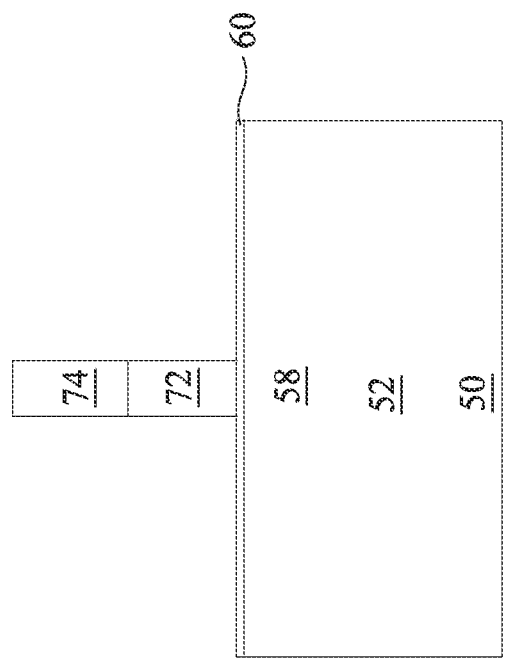
Figure 9C:
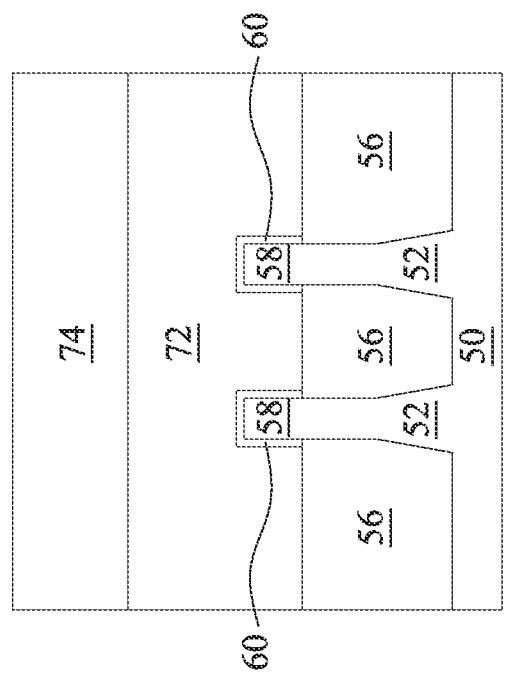
Figure 10D:
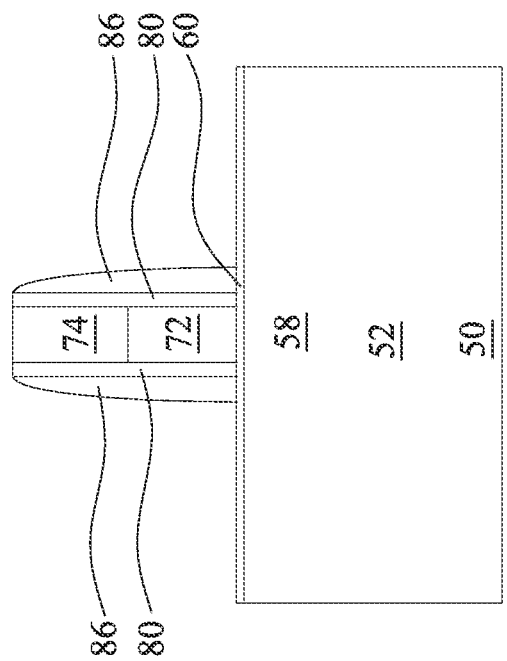
Figure 10C:
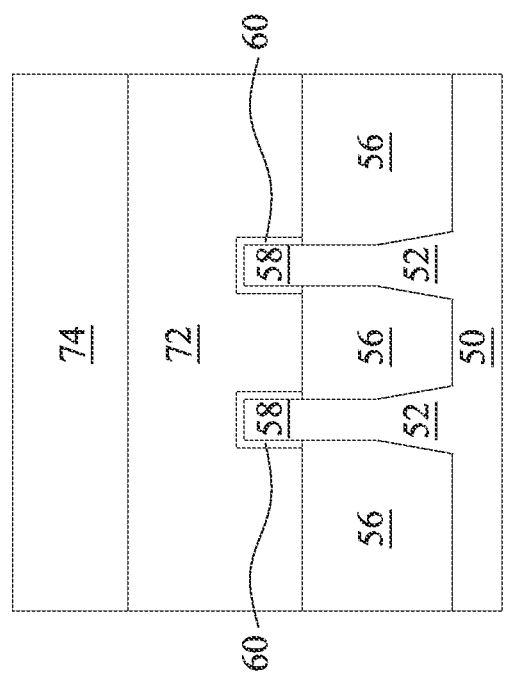

In some embodiments, the dummy gates 72 in the transistor region 50X have a lengthwise direction that is substantially perpendicular to the lengthwise direction of respective fins 52, as shown in FIGS. 8 and 9C-9D. FIGS. 8 and 9A-9B also illustrate the dummy gates 72 in the capacitor region 50C (e.g., the dummy bottom electrodes 95A' and 95B') as having a lengthwise direction that is parallel to the lengthwise direction of the dummy gates 72 in the transistor region 50X. In other embodiments, the dummy gates 72 in the capacitor region 50C have a lengthwise direction that is perpendicular to the lengthwise direction of the dummy gates 72 in the transistor region 50X. In some embodiments, the dummy gates 72 in the capacitor region 50C may comprise both parallel portions and perpendicular portions, or may comprise portions that are neither parallel nor perpendicular (e.g., rounded, oblique, irregular, etc.) to the lengthwise direction of the dummy gates 72 in the transistor region 50X.

The first dummy bottom electrode 95A' and the second dummy bottom electrode 95B' shown in FIGS. 8 and 9A-9B are illustrated examples, and in other embodiments the dummy bottom electrodes 95A' and 95B' may have different dimensions, different shapes, or a different arrangement than shown. As non-limiting examples, in other embodiments, the dummy bottom electrodes 95A' and 95B' may comprise more than two electrodes, "L-shaped" electrodes, or an arrangement of interdigitated "fingers." An example of an interdigitated capacitor structure 130 is described below for FIGS. 28-30, though other shapes or arrangements are possible.

In FIGS. 10A-10D, gate seal spacers 80 and gate spacers 86 are formed in the capacitor region 50C and the transistor region 50X, in accordance with some embodiments. The gate seal spacers 80 are formed on exposed surfaces of the dummy gates 72, the masks 74, and/or the fins 52. The gate seal spacers 80 may be formed, for example, by performing a thermal oxidation or a deposition followed by an anisotropic etch. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed in the transistor region 50X. In the embodiments in which the transistor region 50X includes different device types, the implants may be performed using techniques similar to the implants discussed above for FIG. 6. For example, a mask, such as a photoresist, may be formed over the n-type region of the transistor region 50X, while exposing the p-type region of the transistor region 50X, and appropriate type (e.g., p-type) impurities may be implanted into the exposed fins 52 in the p-type region. The mask may then be removed. Subsequently, a mask, such as a photoresist, may be formed over the p-type region while exposing the n-type region, and appropriate type impurities (e.g., n-type) may be implanted into the exposed fins 52 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities. In some embodiments, impurities are also implanted in the capacitor region 50C.

Still referring to FIGS. 10A-10D, gate spacers 86 are formed on the gate seal spacers 80 along sidewalls of the dummy gates 72 and the masks 74, in accordance with some embodiments. The gate spacers 86 may be formed, for example, by conformally depositing an insulating material and subsequently anisotropically etching the insulating material. The insulating material of the gate spacers 86 may be silicon oxide, silicon nitride, silicon oxynitride, silicon carbonitride, a combination thereof, or the like. The gate spacers 86 may be formed from one layer of insulating material or from multiple layers of various insulating materials.

It is noted that the above disclosure generally describes a process of forming spacers and LDD regions. Other processes and sequences may be used. For example, fewer or additional spacers may be utilized or different sequence of steps may be utilized (e.g., the gate seal spacers 80 may not be etched prior to forming the gate spacers 86 which may yield "L-shaped" gate seal spacers, spacers or layers thereof may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 11A-11D, epitaxial source/drain regions 82 are formed in the fins 52 in the transistor region 50X, in accordance with some embodiments. The epitaxial source/drain regions 82 are formed in the fins 52 such that each dummy gate 72 in the transistor region 50X is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region of the transistor region 50X may be formed, for example, by masking the p-type region of the transistor region 50X and etching source/drain regions of the fins 52 in the n-type region to form recesses in the fins 52. Then, the epitaxial source/drain regions 82 in the n-type region are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region may include materials exerting a tensile strain in the channel region 58, such as silicon, silicon carbide, phosphorous-doped silicon carbide, silicon phosphide, or the like. The epitaxial source/drain regions 82 in the n-type region may have surfaces raised from respective surfaces of the fins 52 and may have facets.

The epitaxial source/drain regions 82 in the p-type region may be formed by masking the n-type region and etching source/drain regions of the fins 52 in the p-type region to form recesses in the fins 52. Then, the epitaxial source/drain regions 82 in the p-type region are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region may comprise materials exerting a compressive strain in the channel region 58, such as silicon germanium, boron-doped silicon germanium, germanium, germanium tin, or the like. The epitaxial source/drain regions 82 in the p-type region may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 11B:
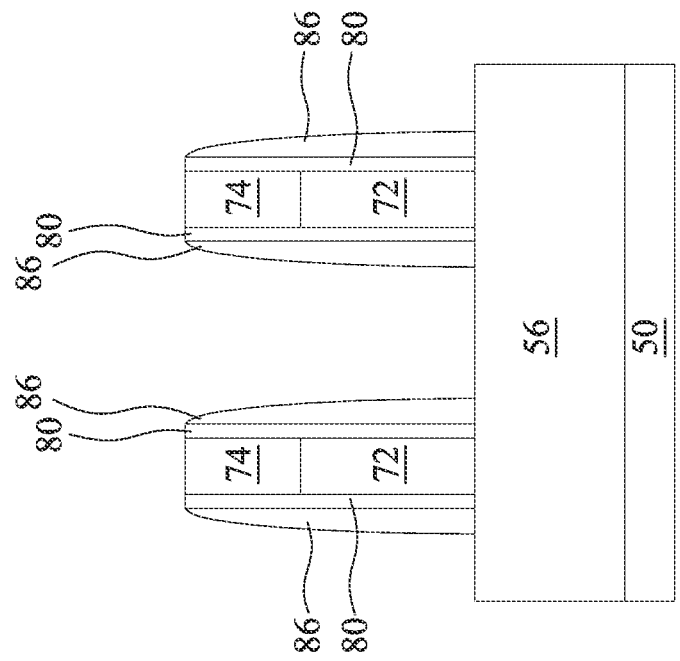
Figure 11A:
Figure 11F:
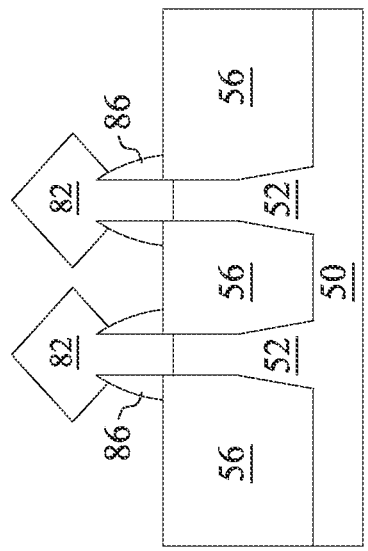
Figure 11E:
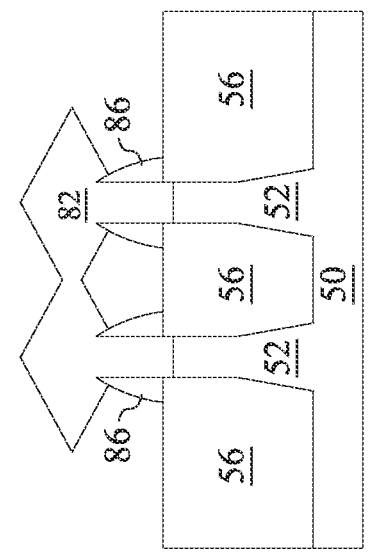
Figure 12B:
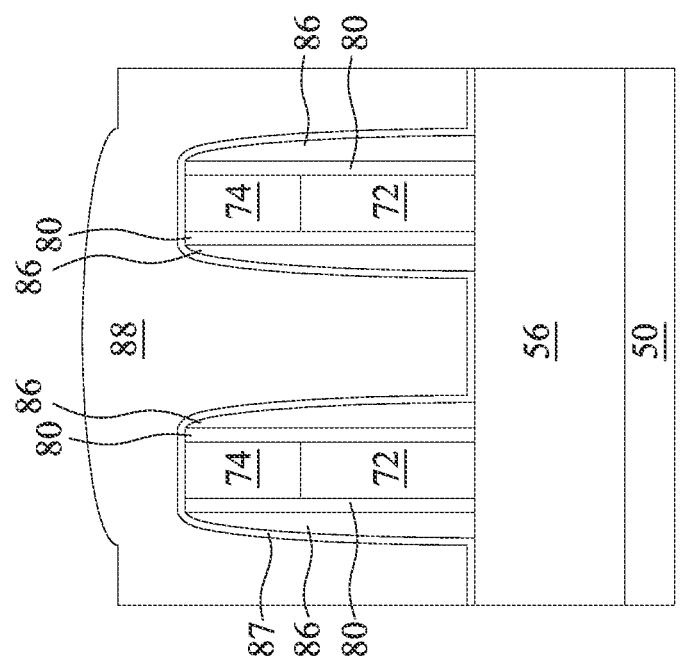
Figure 12A:
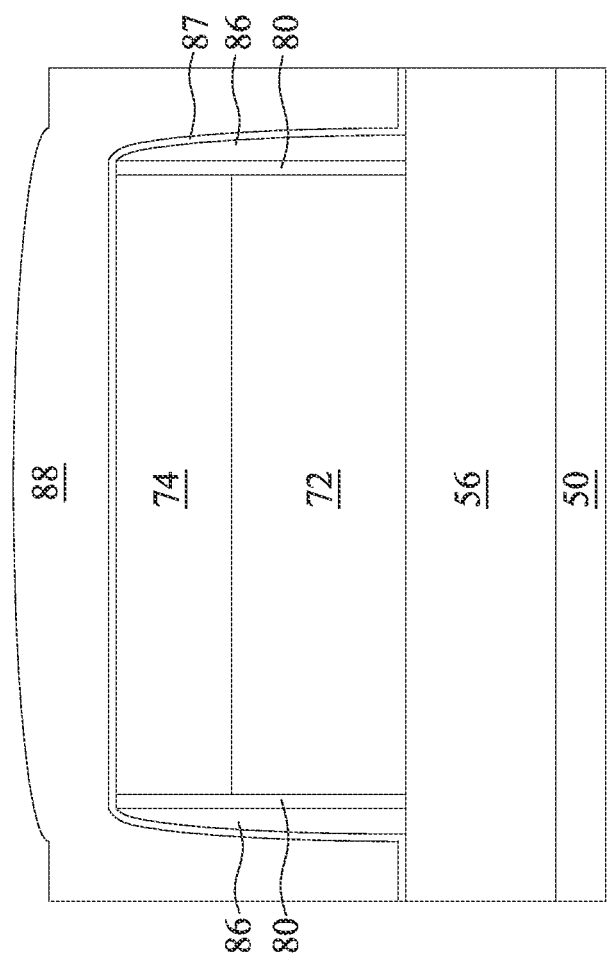
Figure 12D:
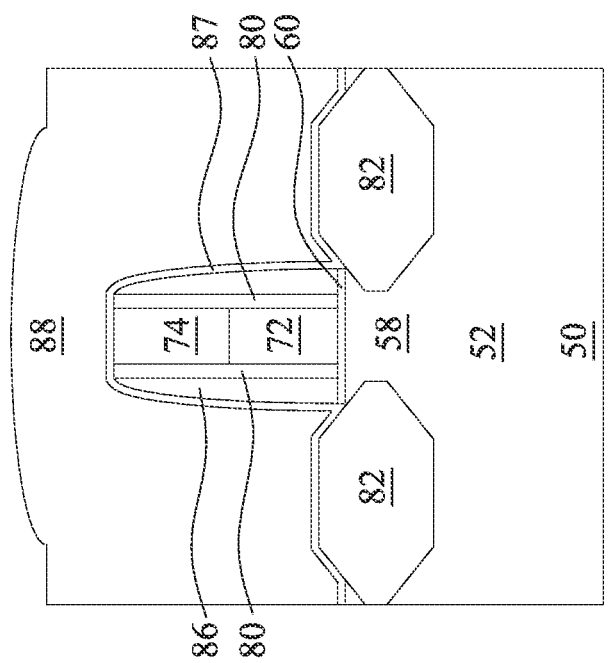
Figure 12C:
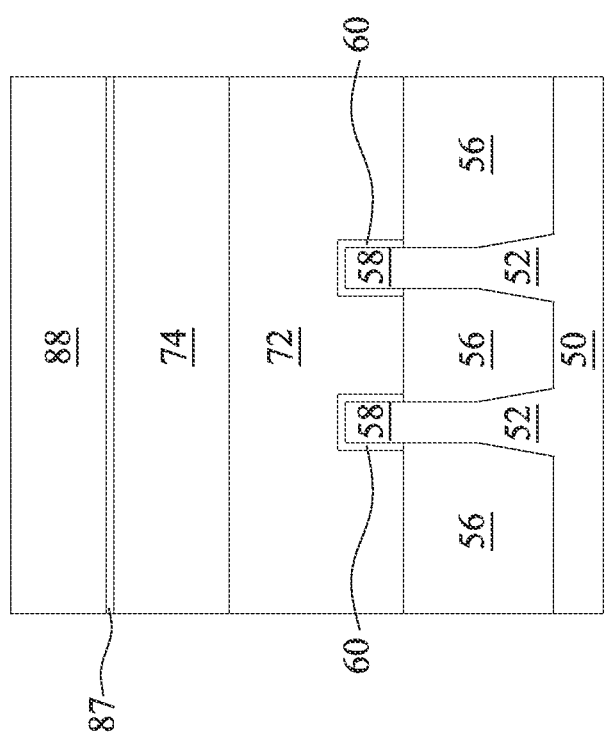

As a result of the epitaxy processes used to form the epitaxial source/drain regions 82 in the n-type region and/or the p-type region of the transistor region 50X, upper surfaces of the epitaxial source/drain regions 82 have facets which expand laterally outward beyond sidewalls of the fins 52. This is shown in FIGS. 11E and 11F, which illustrate example cross-sectional views along the cross-section E-E shown in FIG. 1. In some embodiments, these facets cause adjacent source/drain regions 82 of a same FinFET to merge, as illustrated by FIG. 11E. In other embodiments, adjacent source/drain regions 82 remain separated after the epitaxy process is completed, as illustrated by FIG. 11F. In the embodiments illustrated in FIGS. 11E and 11F, gate spacers 86 are formed covering a portion of the sidewalls of the fins 52 that extend above the STI regions 56 in the transistor region 50X, thereby blocking the epitaxial growth. In some other embodiments, the spacer etch used to form the gate spacers 86 may be adjusted to remove the spacer material to allow the epitaxially grown region to extend to the surface of the STI region 56 in the transistor region 50X.

In FIGS. 12A-12D, a first interlayer dielectric (ILD) 88 is deposited over the structure illustrated in FIGS. 11A-11D, in accordance with some embodiments. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the masks 74, the gate spacers 86, and the epitaxial source/drain regions 82. The CESL 87 may comprise a dielectric material, such as silicon nitride, silicon oxide, silicon oxynitride, or the like, having a lower etch rate than the material of the overlying first ILD 88.

Figure 13:
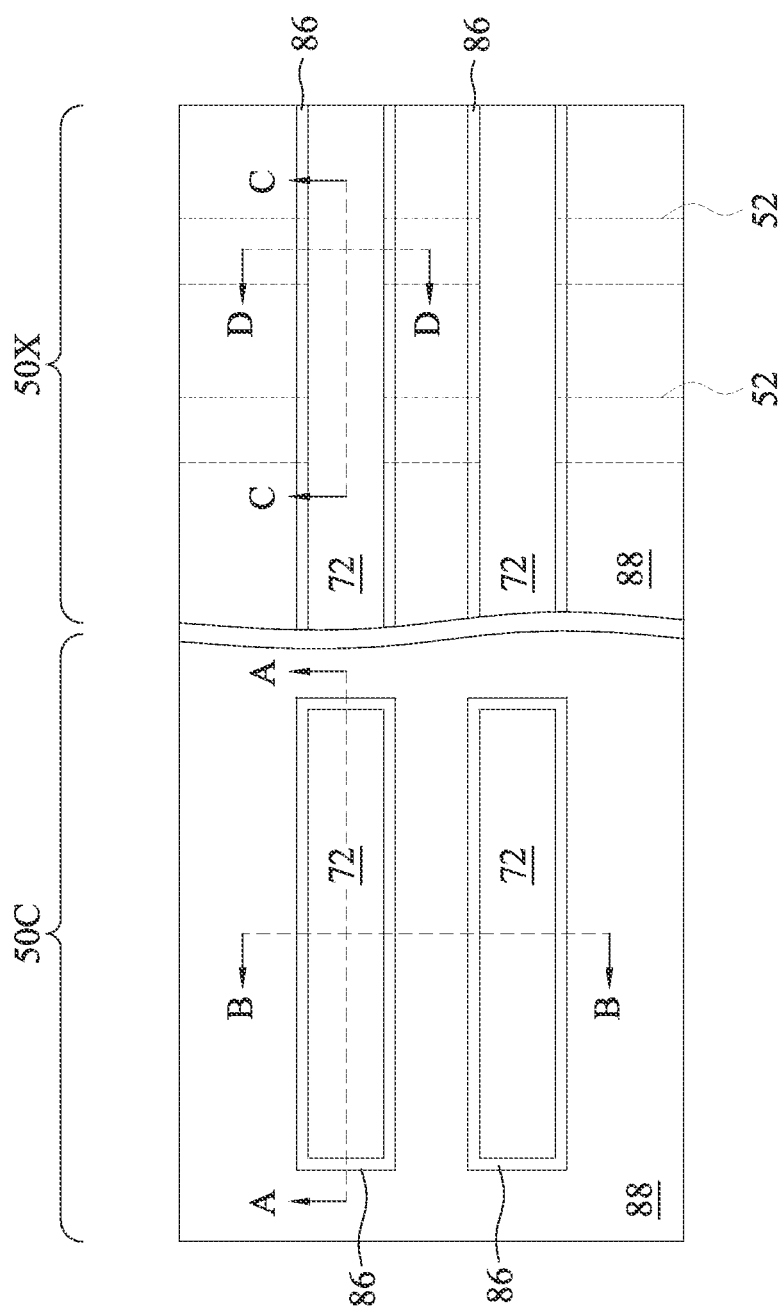
Figure 14B:
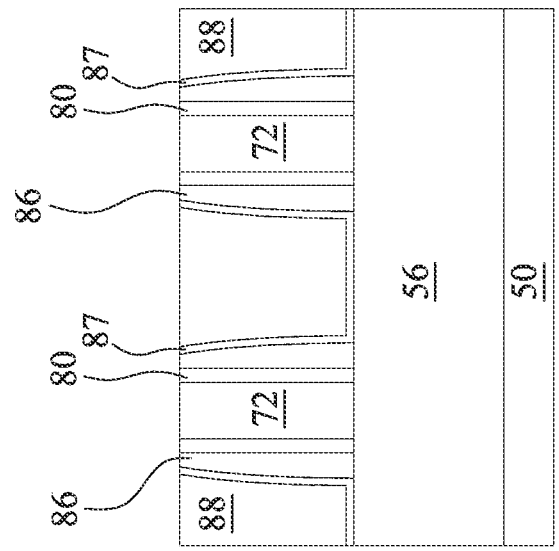
Figure 14A:
Figure 14D:
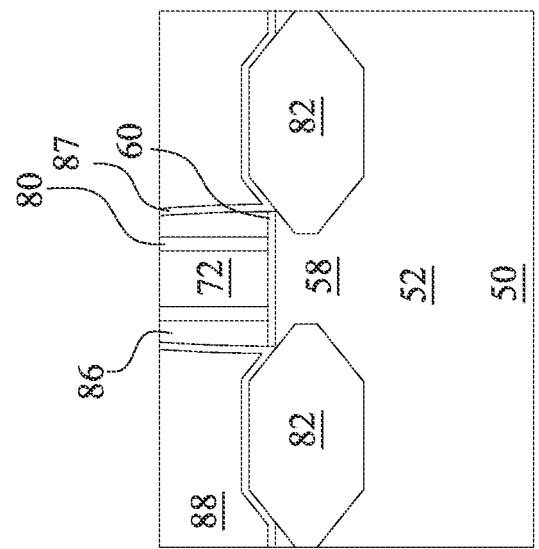
Figure 14C:
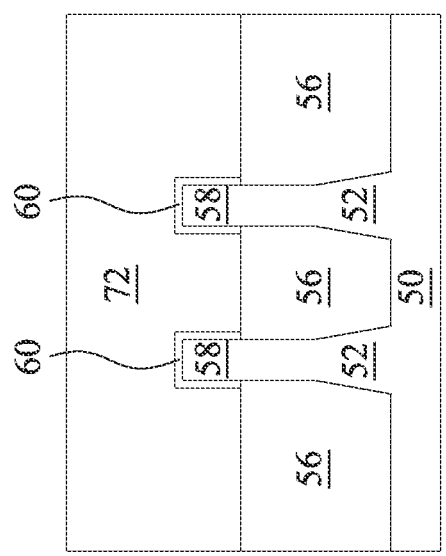

In FIGS. 13 and 14A-14D, a planarization process, such as a CMP, may be performed to level the top surface of the first ILD 88 with the top surfaces of the dummy gates 72 or the masks 74, in accordance with some embodiments. FIG. 13 shows a plan view, and FIGS. 14A-14D show corresponding cross-sectional views. For clarity, the gate seal spacers 80 and the CESL 87 are not shown in FIG. 13. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 15:
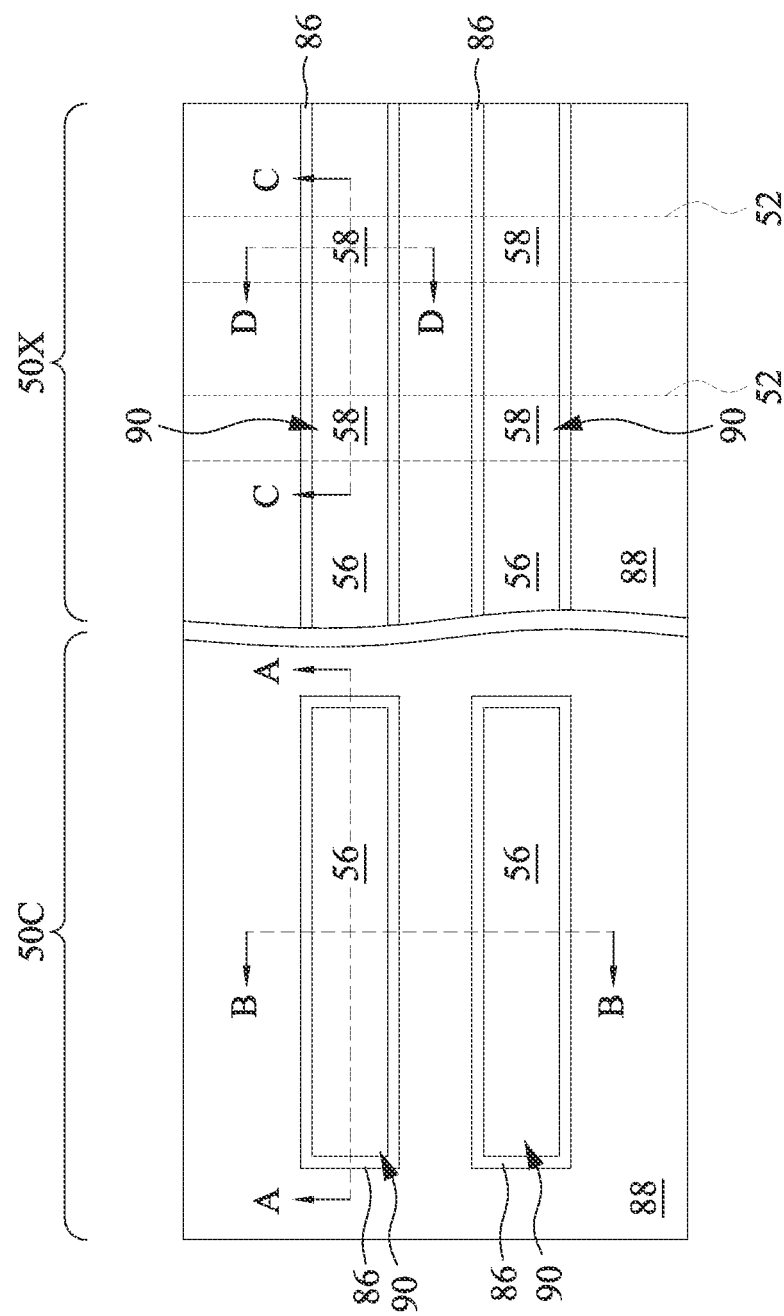
Figure 16B:
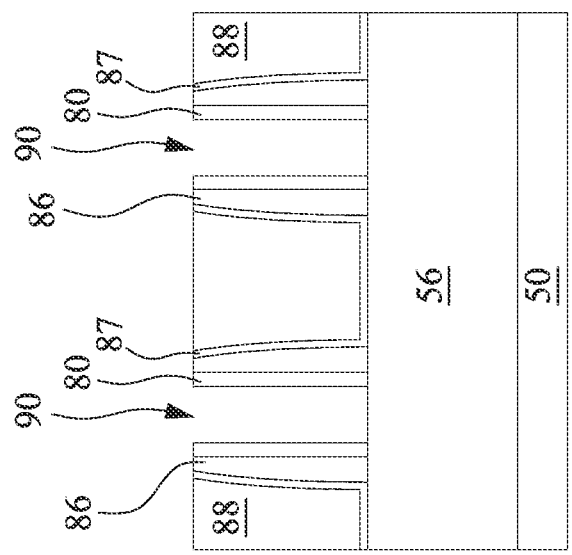
Figure 16A:
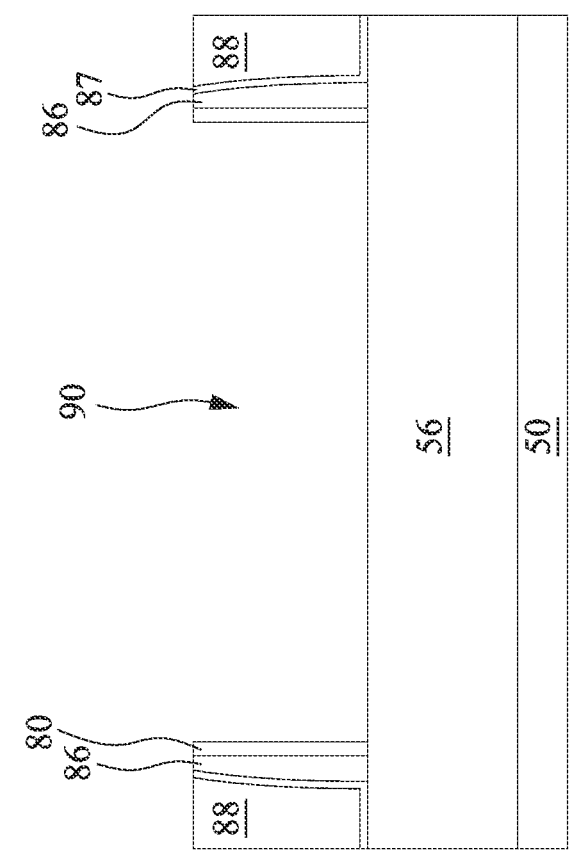
Figure 16D:
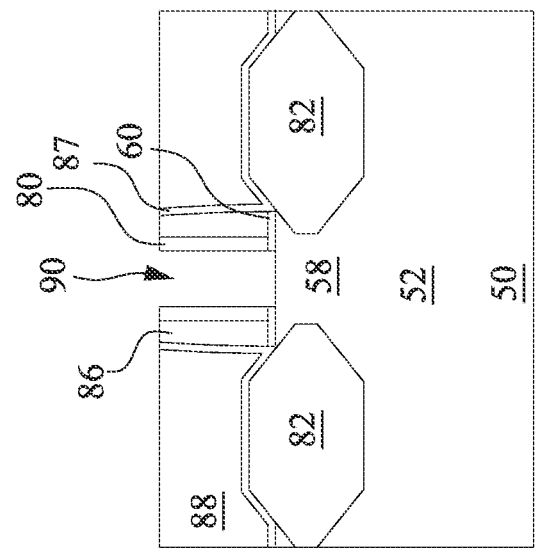
Figure 16C:
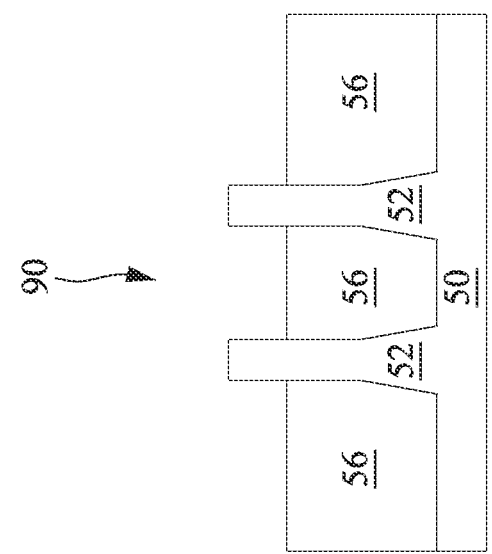

In FIGS. 15 and 16A-16D, the dummy gates 72, and the masks 74 (if present) are removed in one or more etching steps, so that recesses 90 are formed, in accordance with some embodiments. FIG. 15 shows a plan view, and FIGS. 16A-16D show corresponding cross-sectional views. For clarity, the gate seal spacers 80 and the CESL 87 are not shown in FIG. 15. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. The recesses 90 may expose portions of the STI regions 56, in some embodiments. Each recess 90 in the transistor region 50X exposes and/or overlies a channel region 58 of a respective fin 52, and each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

In FIGS. 17 and 18A-18D, gate dielectric layers 92 and gate electrode layers 94 are formed in the recesses 90, forming bottom electrodes 95A and 95B in the capacitor region 50C and forming gate stacks 97 in the transistor region 50X, in accordance with some embodiments. FIG. 17 shows a plan view, and FIGS. 18A-18D show corresponding cross-sectional views. For clarity, the gate seal spacers 80 and the CESL 87 are not shown in FIG. 17. FIG. 18E illustrates a detailed view of region 89 of FIG. 18D. Gate dielectric layers 92 comprise one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. For embodiments in which portions of the dummy dielectric layer 60 remains in the recesses 90, the gate dielectric layers 92 may include a material of the dummy dielectric layer 60 (e.g., silicon oxide or the like).

Figure 18B:
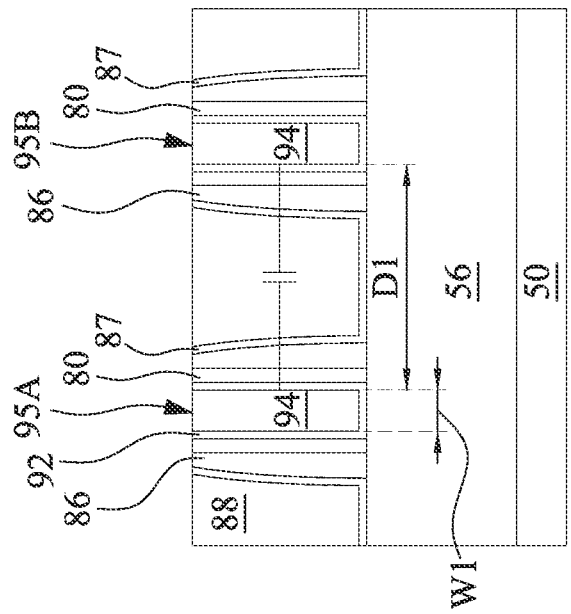
Figure 18A:
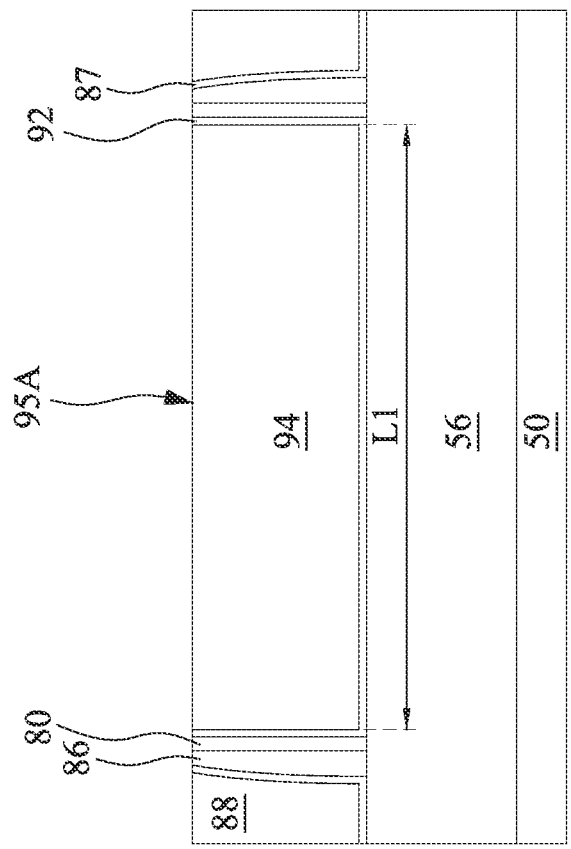
Figure 18D:
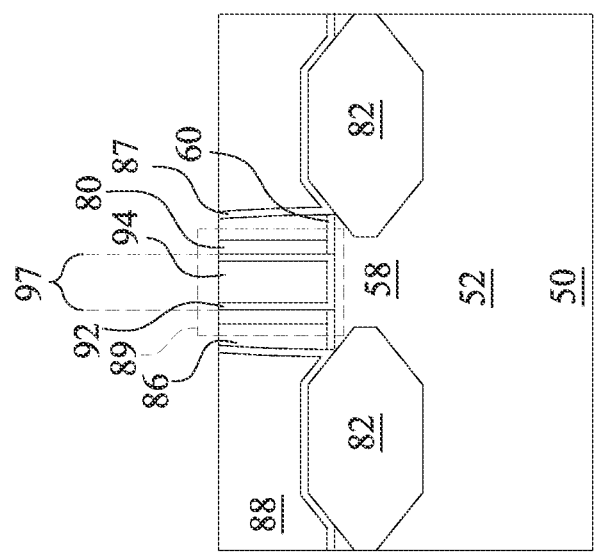
Figure 18C:
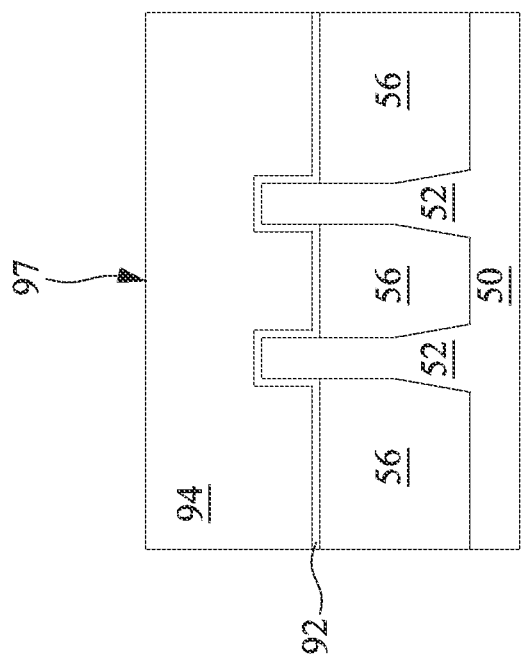
Figure 19B:
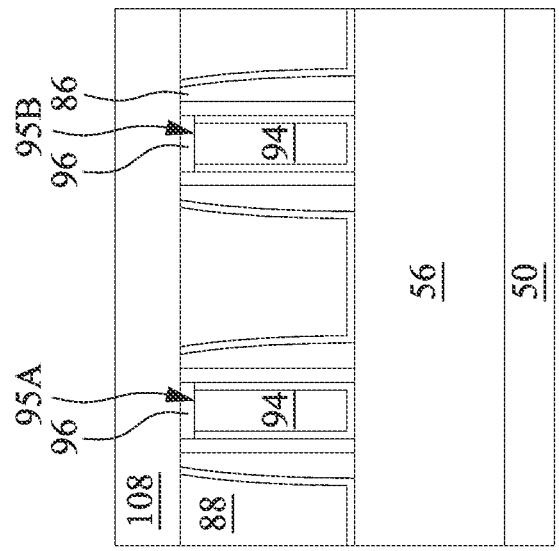
Figure 19A:
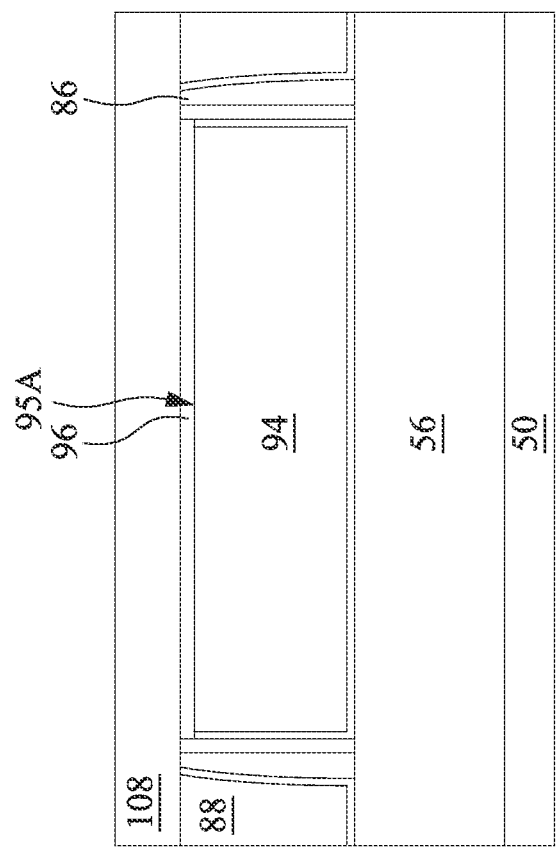
Figure 19D:
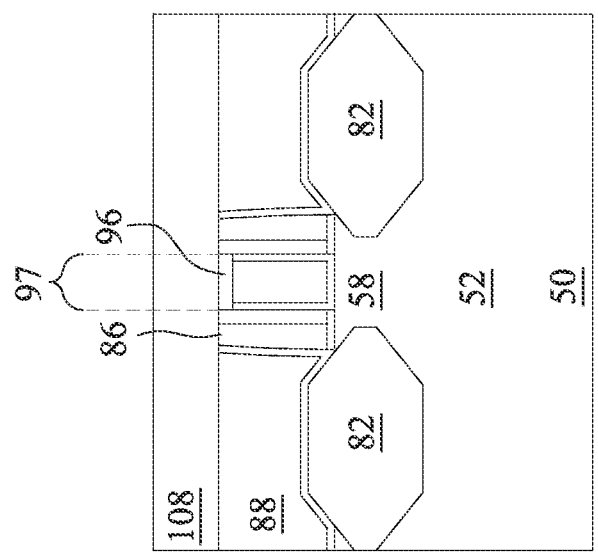
Figure 19C:
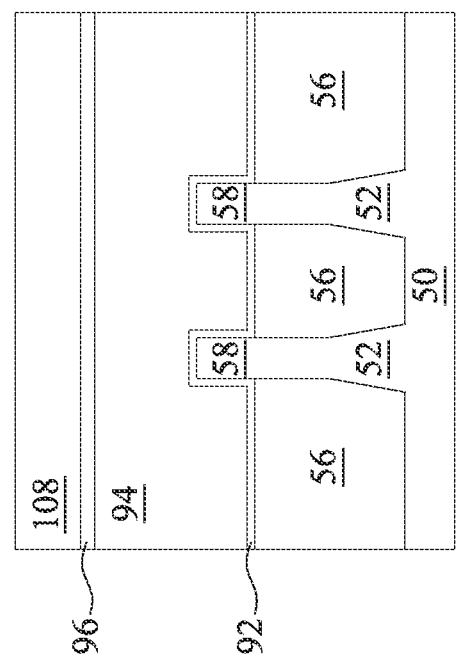

The gate electrode layers 94 are deposited over the gate dielectric layers 92, respectively, and fill the remaining portions of the recesses 90. The gate electrode layers 94 may include a metal-containing material such as titanium nitride, titanium oxide, tantalum nitride, tantalum carbide, cobalt, ruthenium, aluminum, tungsten, combinations thereof, or multi-layers thereof. For example, although a single gate electrode layer 94 is illustrated in FIGS. 18A-18D, the gate electrode layers 94 may comprise any number of liner layers 94A, any number of work function tuning layers 94B, and a fill material 94C as illustrated by FIG. 18E. After the filling of the recesses 90, a planarization process, such as a CMP, may be performed to remove the excess portions of the gate dielectric layers 92 and the material of the gate electrode layers 94, which excess portions are over the top surface of the ILD 88.

The remaining portions of material of the gate electrode layers 94 and the gate dielectric layers 92 in the transistor region 50X form gate stacks 97 of the resulting FinFETs. The gate electrode layers 94 and the gate dielectric layers 92 may also be collectively referred to as a "replacement gate" or a "gate structure." The gate stacks 97 may extend along sidewalls of a channel region 58 of the fins 52.

The remaining portions of material of the gate electrode layers 94 in the capacitor region 50C form the first bottom electrode 95A and the second bottom electrode 95B of the capacitor structure 120, in accordance with some embodiments. In this manner, the bottom electrodes 95A-B of a capacitor structure may be formed simultaneously with the gate stacks 97 of the FinFET structure 119.

By forming electrodes of a capacitor structure along with the gate stacks of transistors, additional electrodes of a capacitor structure can be formed without the use of additional masks or other additional process steps. In some embodiments, one of the bottom electrodes 95A-B may be connected to a "high" terminal (e.g., a high voltage) and the other of the bottom electrodes 95A-B may be connected to a "low" terminal (e.g., a low voltage). In some embodiments, both the "high" and the "low" bottom electrodes are formed using the same processes, such as both formed using processes for n-type devices or both formed using processes for p-type devices. In other embodiments, the "high" bottom electrode is formed using processes for n-type devices and the "low" bottom electrode is formed using processes for p-type devices. In other embodiments, the "high" bottom electrode is formed using processes for p-type devices and the "low" bottom electrode is formed using processes for n-type devices The capacitance between the first bottom electrode 95A and the second bottom electrode 95B (shown schematically in FIG. 18B and in some subsequent figures) adds to the overall capacitance of the capacitor structure 120. In some cases, the bottom electrodes 95A-B may be considered a parallel lateral capacitor that increases the capacitance of the capacitor structure 120. In some embodiments, the bottom electrodes 95A-B may have a rectangular shape with a length L1 that is in the range of about 100 nm to about 10,000 nm or a width W1 that is in the range of about 10 nm to about 100 nm, though other dimensions or shapes are possible. In some embodiments, the bottom electrodes 95A-B may be separated by a distance D1 that is in the range of about 10 nm to about 1000 nm, though other distances are possible. In some cases, the dimensions or distances may be chosen based on an operating voltage of the device. In some embodiments, the additional capacitance provided to the capacitor structure 120 by the bottom electrodes 95A-B may be controlled by controlling the length L1, width W1, and/or separation distance D1. For example, increasing the length L1 of the bottom electrodes 95A-B or decreasing the separation distance D1 may increase the additional capacitance. In some embodiments, more than two bottom electrodes 95 may be used, or one or more of the bottom electrodes 95 may comprise two or more separated sections. In this manner, the capacitance of the resulting capacitor structure 120 may also be controlled.

The formation of the gate dielectric layers 92 in the n-type region and the p-type region of the transistor region 50X may occur simultaneously such that the gate dielectric layers 92 in both type regions (e.g., the n-type region and the p-type region) are formed from the same materials using the same processes, and the formation of the gate electrode layers 94 may occur simultaneously such that the gate electrode layers 94 in both type regions are formed from the same materials using the same processes. Accordingly, the gate dielectric layers 92 and the gate electrode layers 94 in the capacitor region 50C may be formed from the same respective materials as the gate dielectric layers 92 and the gate electrode layers 94 in the transistor region 50X.

In some embodiments, the gate dielectric layers 92 in the n-type region of the transistor region 50X may be formed by processes distinct from the p-type region of the transistor region 50X. In this manner, the gate dielectric layers 92 and/or the gate electrode layers 94 may be different materials in each type region, which may be formed using distinct processes in each type region. In some embodiments, the gate dielectric layers 92 and the gate electrode layers 94 in the capacitor region 50C may be formed using the processes and materials used for the n-type region of the transistor region 50X or formed using the processes and materials used for the p-type region of the transistor region 50X. For example, both of the bottom electrodes 95A-B may be formed using the same processes and materials, which may correspond to the processes and materials of the n-type region or to the processes and materials of the p-type region. In some embodiments, one of the bottom electrodes 95A-B is formed using the processes and materials used for the n-type region and the other of the bottom electrodes 95A-B is formed using the processes and materials used for the p-type region. Various masking steps may be used to mask and expose appropriate regions when using distinct processes.

In FIGS. 19A-19D, a gate mask 96 is formed over the gate dielectric layers 92 and/or the gate electrode layers 94, in accordance with some embodiments. The gate mask 96 may be disposed between opposing portions of the gate spacers 86. In some embodiments, forming the gate mask 96 includes recessing the gate dielectric layers 92 and/or the gate electrode layers 94 so that a recess is formed directly over the gate dielectric layers 92 and/or the gate electrode layers 94 and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88. The gate mask 96 is optional and may be omitted in some embodiments. In such embodiments, the gate dielectric layers 92 and the gate electrode layers 94 may remain level with top surfaces of the first ILD 88.

As also illustrated in FIGS. 19A-19D, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed electrode contacts 111 (FIGS. 20 and 21A-21B) and gate contacts 110 (FIGS. 21C and 21D) penetrate through the second ILD 108 and the gate mask 96 (if present) to contact top surfaces of the recessed gate electrode layers 94.

Figure 21D:
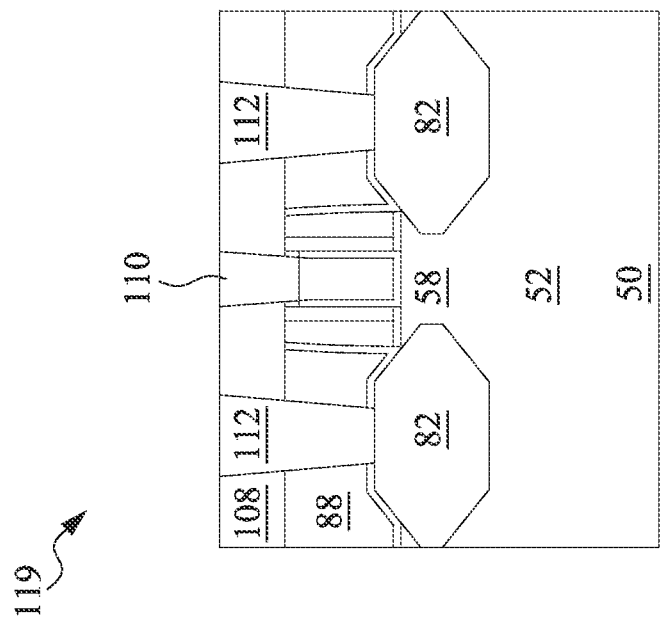
Figure 21C:
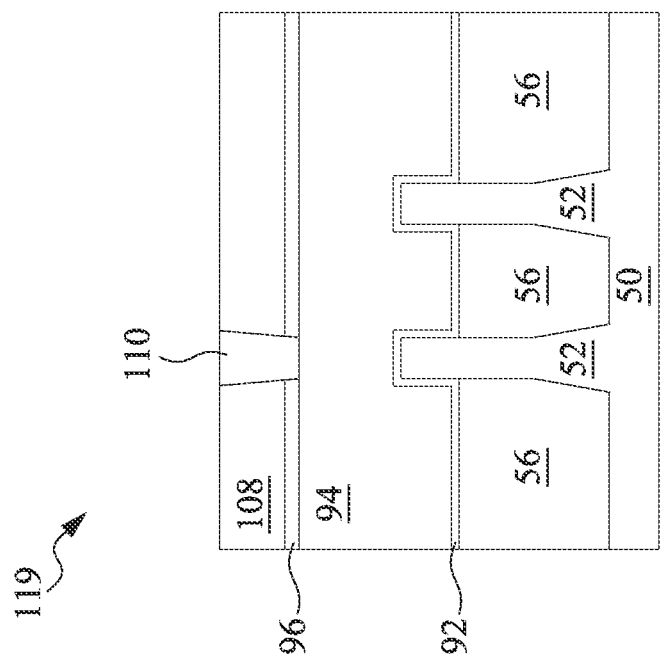

In FIGS. 20 and 21A-21D, electrode contacts 111, gate contacts 110, and source/drain contacts 112 are formed through the second ILD 108 and the first ILD 88 in accordance with some embodiments. FIG. 20 illustrates a plan view of the capacitor region 50C, FIGS. 21A-21B illustrate cross-sectional views of the capacitor region 50C, and FIGS. 21C-21D illustrate cross-sectional views of the transistor region 50X. The electrode contacts 111 include electrode contacts 111A connected to the first bottom electrode 95A and electrode contacts 111B connected to the second bottom electrode 95B, as shown in FIGS. 20, 21A, and 21B.

As an example for forming the electrode contacts 111 and the gate contacts 110, openings for the electrode contacts 111 and the gate contacts 110 may be formed through the second ILD 108 and the gate mask 96 (if present). In some embodiments, openings for the source/drain contacts 112 may also be formed through the first ILD 88 and the second ILD 108. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the electrode contacts 111, the gate contacts 110, and the source/drain contacts 112 in the openings. An anneal process may be performed to form a silicide at the interface between the epitaxial source/drain regions 82 and the source/drain contacts 112.

In the capacitor region 50C, the electrode contacts 111A-B are physically and electrically coupled to the bottom electrodes 95A-B. In the transistor region 50X, the source/drain contacts 112 are physically and electrically coupled to the epitaxial source/drain regions 82, and the gate contacts 110 are physically and electrically coupled to the gate electrodes 106. The electrode contacts 111, the gate contacts 110, and the source/drain contacts 112 may be formed in different processes, or may be formed in the same process. In some embodiments, the electrode contacts 111 and the gate contacts 110 are formed using the same process. In some embodiments, top surfaces of the second ILD 108, the electrode contacts 111, the gate contacts 110, and/or the source/drain contacts 112 are level. Although shown as being formed in the same cross-sections, it should be appreciated that each of the source/drain contacts 112 and gate contacts 110 may be formed in different cross-sections, which may avoid shorting of the contacts. Although shown as being formed in the same cross-sections, it should be appreciated that electrode contacts 111A and electrode contacts 111B may be formed in different cross-sections. In some embodiments, the electrode contacts 111 have a pitch P1 that is in the range of about 20 nm to about 200 nm. In some embodiments, the electrode contacts 111A and the electrode contacts 111B are separated by a distance D2 that is in the range of about 10 nm to about 100 nm. In other embodiments, the electrode contacts 111 may have a different size, number, or arrangement than shown.

FIGS. 21C and 21D show a FinFET structure 119, in accordance with some embodiments. Subsequent processing of the transistor region 50X and the FinFET structure 119 is not shown in subsequent figures, though processing steps similar to those described below for the capacitor region 50C may be performed on the transistor region 50X, in some embodiments. It should be appreciated that the disclosed FinFET embodiments could also be applied to nanostructure devices such as nanostructure (e.g., nanosheet, nanowire, gate-all-around, or the like) field effect transistors (NS-FETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Figure 22B:
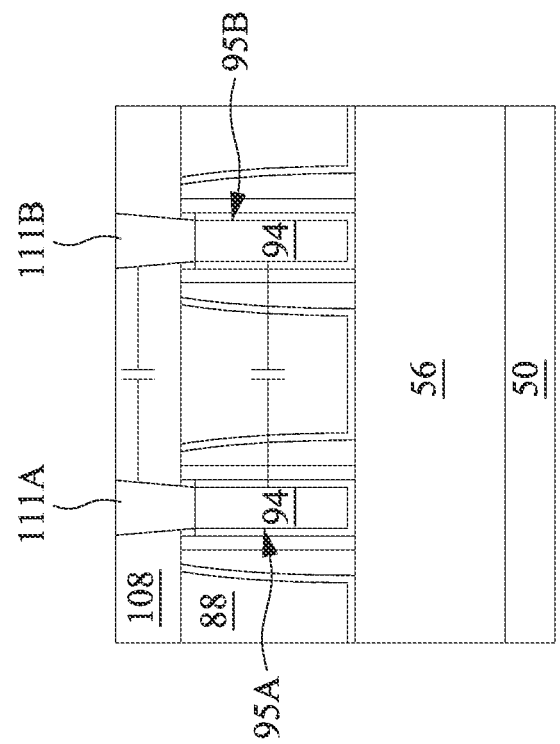
Figure 22A:
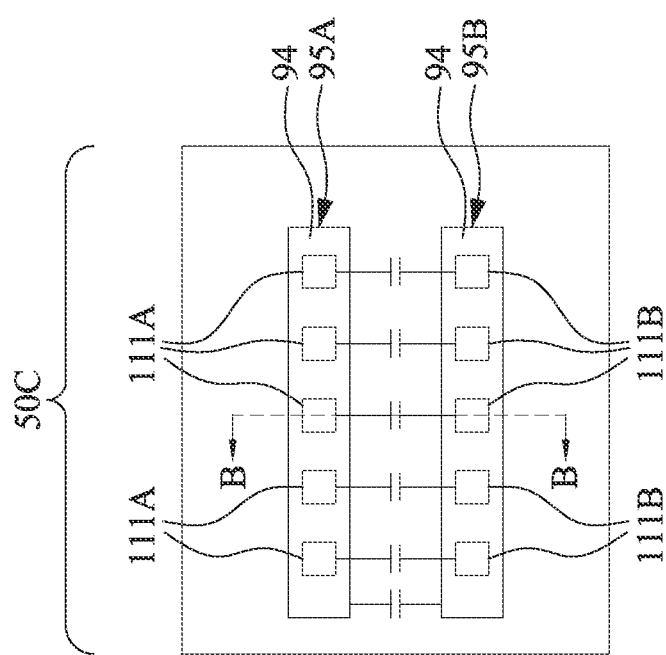
Figure 26:
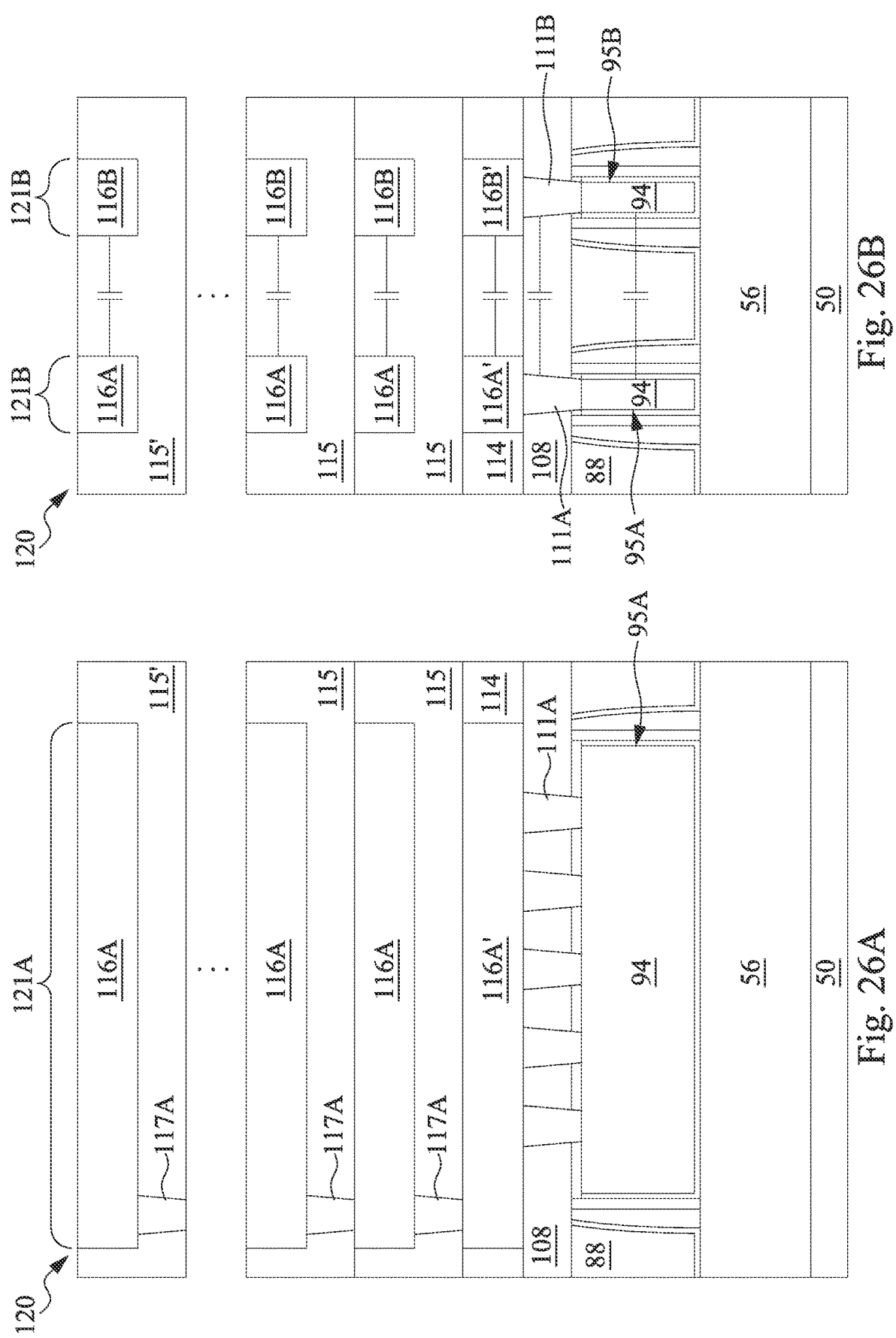
Figure 27:
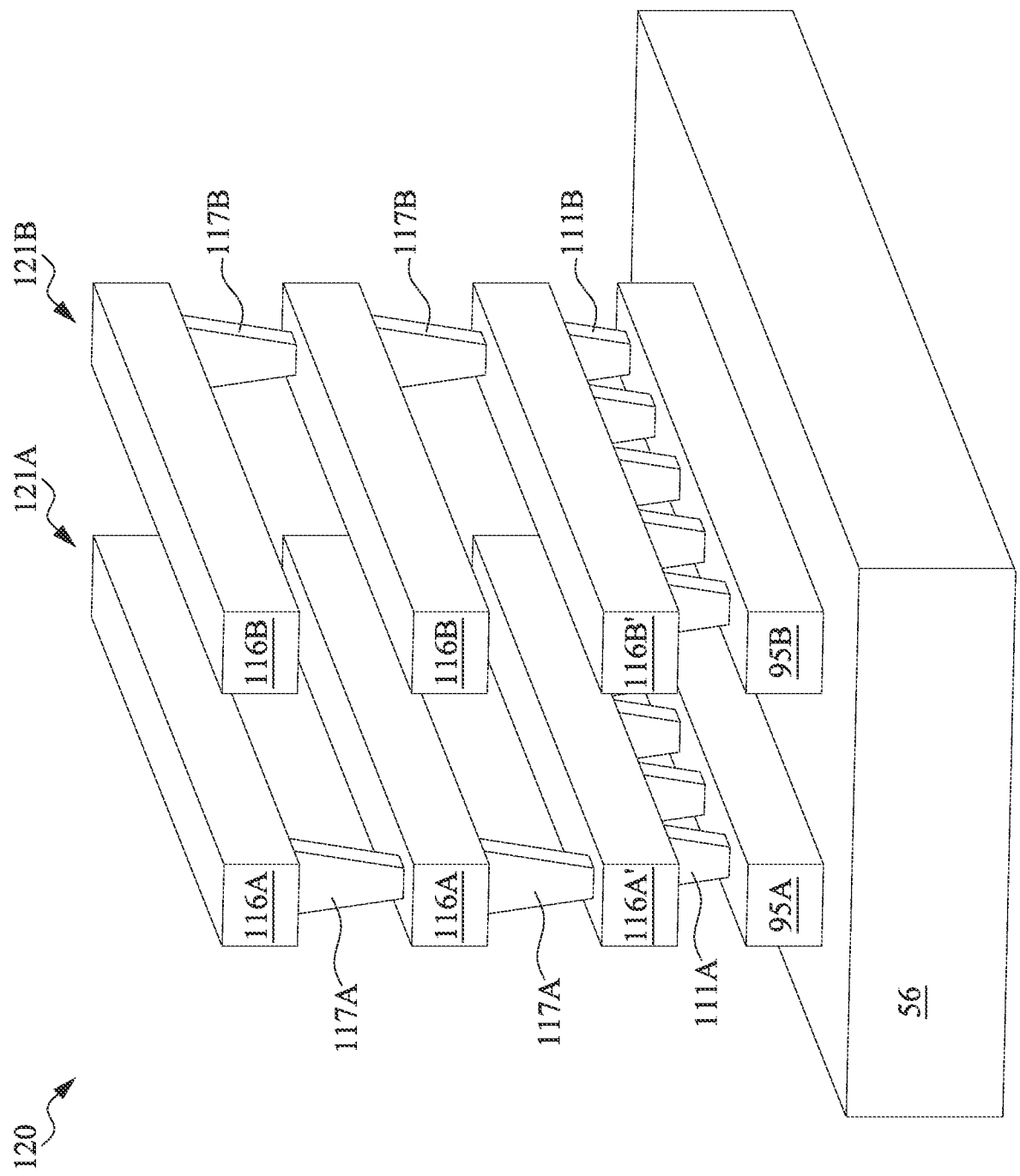
FIG. 27 illustrates an example of a capacitor structure in a three-dimensional view, in accordance with some embodiments.

The formation of bottom electrodes 95A-B and electrode contacts 111A-B as described herein can allow for increased capacitance of a capacitor structure 120 (FIGS. 26A-27). FIG. 22A shows a plan view similar to that shown in FIG. 20 and FIG. 22B shows a cross-sectional view similar to that shown in FIG. 21B. As described previously, the capacitance between the bottom electrodes 95A-B (indicated schematically in FIGS. 22A-22B) increases the capacitance of the capacitor structure 120. Additionally, the electrode contacts 111A-B as described herein can also increase the capacitance of the capacitor structure 120. For example, as shown schematically in FIGS. 22A-22B, the capacitance between electrode contacts 111A and neighboring electrode contacts 111B can also contribute to the overall capacitance of the capacitor structure 120. In some cases, the pairs of electrode contacts 111A-B may be considered parallel lateral capacitors or additional sets of electrodes that increase the capacitance of the capacitor structure 120. In this manner, the capacitance of a capacitor structure can be increased without increasing the area of the capacitor structure or without forming additional electrodes at the top of the capacitor structure. In some embodiments, the additional capacitance provided by the electrode contacts 111A-B may be controlled by controlling the spacing (e.g., the separation distance D2), the number, or the arrangement of the electrode contacts 111A-B. For example, increasing the number of pairs of electrode contacts 111A-B or decreasing the separation distance D2 may increase the additional capacitance. In some cases, the use of bottom electrodes 95A-B and electrode contacts 111A-B as described herein may increase the capacitance of a capacitor structure by as much as about 15%, though larger increases are possible. In some embodiments, the capacitance contributed by the bottom electrodes 95A-B may be in the range of about 5% to about 10% of the total capacitance, and the capacitance contributed by the electrode contacts 111A-B may be in the range of about 2.5% to about 5% of the total capacitance. Other capacitances may be possible.

Figure 23:
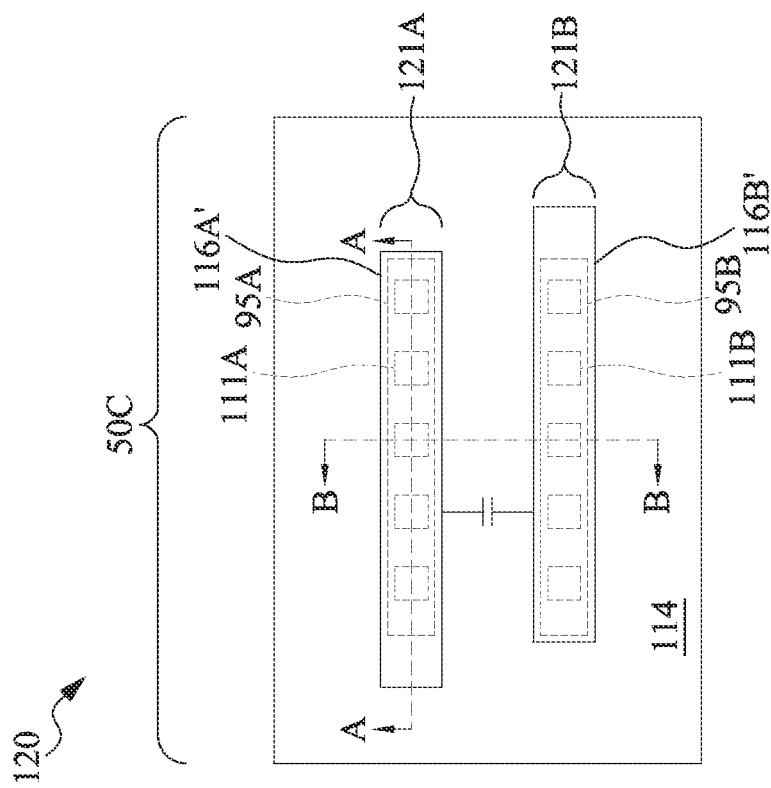
Figure 24:
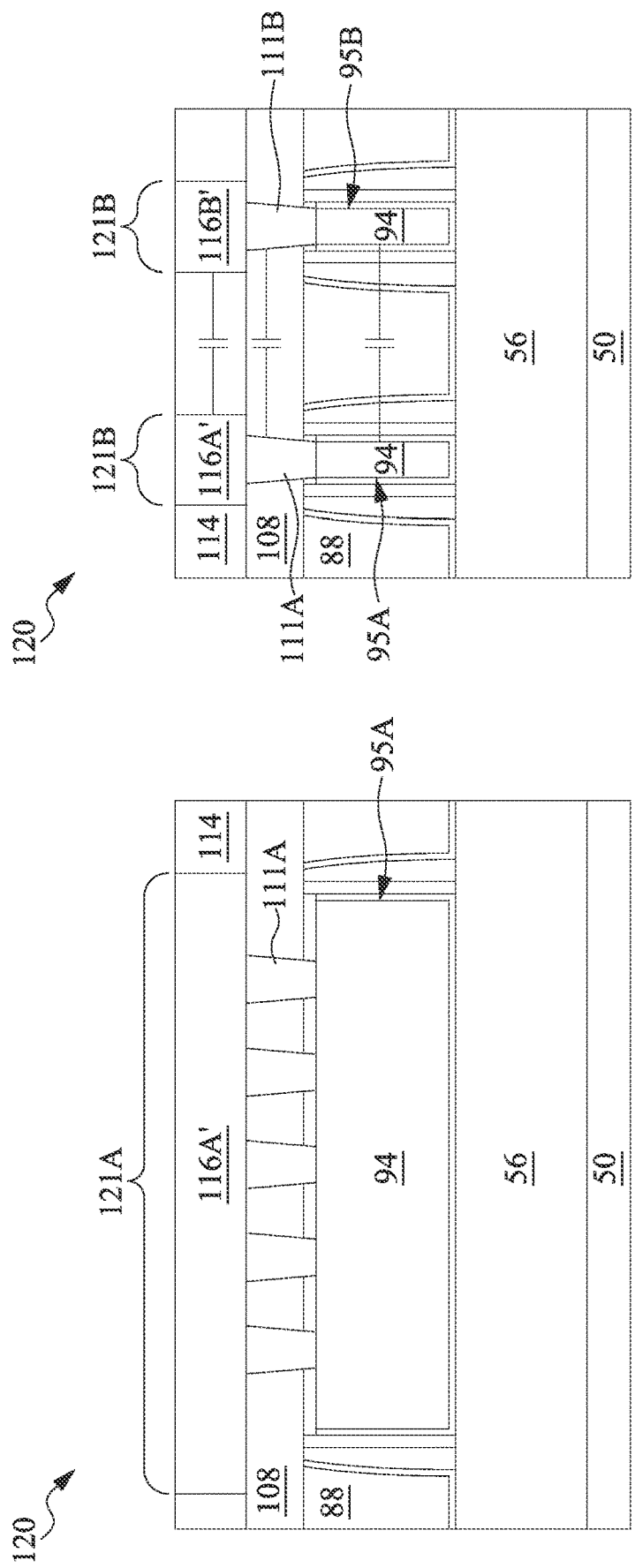
Figure 25:
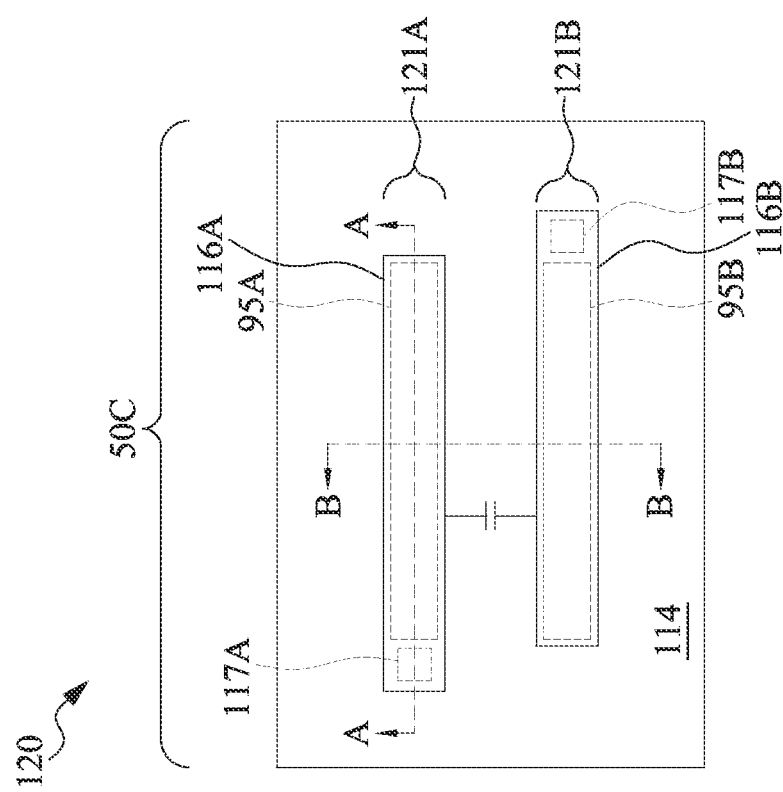

FIGS. 23 through 27 illustrate various views of intermediate steps in the formation of a capacitor structure 120, in accordance with some embodiments. FIGS. 23 and 24A-24B show electrodes 116A' and 116B' formed in a dielectric layer 114 over the electrode contacts 111A-B, and FIGS. 25-27 show additional electrodes 116A-B formed in additional dielectric layers 115 over the dielectric layer 114. The electrodes 116A' in the dielectric layer 114 are electrically coupled to the electrode contacts 111A and the bottom electrode 95A, and the electrodes 116B' in the dielectric layer 114 are electrically coupled to the electrode contacts 111B and the bottom electrode 95B. The electrodes 116A in the dielectric layers 115 are electrically coupled to each other and to the electrodes 116A' by vias 117A, and electrodes 116B in the dielectric layers 115 are electrically coupled to each other and to the electrodes 116B' by vias 117B. The electrode 116A' forms a parallel lateral capacitor with the electrode 116B', and each electrode 116A forms a parallel lateral capacitor with a corresponding electrode 116B. The capacitance of the pair of electrodes 116A'-B' and each pair of electrodes 116A-B adds to the overall capacitance of the capacitor structure 120. In this manner, the bottom electrode 95A, the electrode contacts 111A, the electrode 116A', and the electrodes 116A form a first capacitor electrode 121A of the capacitor structure 120, and the bottom electrode 95B, the electrode contacts 111B, the electrode 116B', and the electrodes 116B form a second capacitor electrode 121B of the capacitor structure 120. In some embodiments, one of the capacitor electrodes 121A-B may be connected to a "high" terminal (e.g., a high voltage) and the other of the capacitor electrodes 121A-B may be connected to a "low" terminal (e.g., a low voltage).

In some embodiments, the electrodes 116A'-B' and/or the electrodes 116A-B are formed using the same process that forms metallization patterns, conductive lines, or the like of the device, such as those that may be formed over the transistor region 50X. For example, a first metallization pattern of the device may be formed in the dielectric layer 114, with subsequent metallization patterns formed in subsequently formed dielectric layers 115. In this manner, the dielectric layer 114 and/or the dielectric layers 115 may be considered inter-metal dielectric (IMD) layers, in some cases. The electrodes 116A'-B' and/or the electrodes 116A-B may be formed using a suitable process, such as a damascene process, a dual damascene process, or another process. In some embodiments, the electrodes 116A'-B' and/or the electrodes 116A-B vertically overlap the bottom electrodes 95A-B, and the electrodes 116A'-B' and/or the electrodes 116A-B may have similar sizes or shapes as the bottom electrodes 95A-B.

Turning to FIGS. 23 and 24A-24B, electrodes 116A'-B' are formed in a dielectric layer 114 over the bottom electrodes 95A-B, in accordance with some embodiments. FIG. 23 shows a plan view, and FIGS. 24A-24B show corresponding cross-sectional views. The electrode 116A' is physically and electrically coupled to the electrode contacts 111A and the electrode 116B' is physically and electrically coupled to the electrode contacts 111B. As shown schematically in FIGS. 23 and 24B, the capacitance between the electrodes 116A'-B' provides some of the overall capacitance of the capacitor structure 120 in addition to the capacitance between the electrode contacts 111A-B and between the bottom electrodes 95A-B. In some embodiments, the electrodes 116A'-B' may have a different length than the length L1 (see FIG. 18A) of the bottom electrodes 95A-B or may have a different width than the width W1 (see FIG. 18B) of the bottom electrodes 95A-B. For example, the electrodes 116A'-B' may have a length greater than L1 or a width greater than W1, though other combinations of length and width are possible.

As an example of forming the electrodes 116A'-B' shown in FIGS. 23 and 24A-24B, the dielectric layer 114 may be formed over the second ILD 108 and the electrode contacts 111A-B. The dielectric layer 114 may be similar to the second ILD 108, and may be formed using similar techniques. Other materials or techniques are possible. An optional etch stop layer (not shown) may be formed between the second ILD 108 and the dielectric layer 114. Openings corresponding to pattern of the electrodes 116A'-B' may then be patterned in the dielectric layer 114, with the openings exposing surfaces of the electrode contacts 111A-B. A conductive material may be deposited within the openings to form the electrodes 116A'-B'. The conductive material may be similar to those described for the electrode contacts 111A-B, the gate contacts 110, and the source/drain contacts 112 (see FIGS. 21A-21D), and may be formed in a similar manner. Other conductive materials or deposition techniques are possible. A planarization process may be performed to remove excess conductive material from the dielectric layer 114. FIGS. 24A-24B show the electrodes 116A'-B' as having substantially vertical sidewalls, but the electrodes 116A'-B' may have sloped sidewalls, curved sidewalls, or another sidewall profile in other embodiments.

Turning to FIGS. 25 and 26A-26B, additional electrodes 116A-B are formed over the electrodes 116A'-B', in accordance with some embodiments. FIG. 25 shows a plan view, and FIGS. 26A-26B show corresponding cross-sectional views. The electrodes 116A-B may include multiple sets of electrodes 116A-B formed in multiple dielectric layers 115 over the electrodes 116A'-B'. In some embodiments, the electrodes 116A-B are physically and electrically coupled to overlying or underlying features by vias 117A-B. For example, in the bottom-most dielectric layer 115 over the dielectric layer 114, the electrodes 116A are physically and electrically coupled to the electrodes 116A' by one or more vias 117A, and the electrodes 116B are physically and electrically coupled to the electrodes 116B' by one or more vias 117B. Each subsequent electrode 116A in a dielectric layer 115 is physically and electrically coupled to an underlying electrode 116A by one or more vias 117A, and each subsequent electrode 116B in a dielectric layer 115 is physically and electrically coupled to an underlying electrode 116B by one or more vias 117B. As schematically shown in FIGS. 25 and 26B, the capacitance between each pair of electrodes 116A-B provides additional capacitance for the capacitor structure 120. The electrodes 116A-B may have similar dimensions as the electrodes 116A'-B' or may have different dimensions than the electrodes 116A'-B'. The vias 117A-B may or may not overlap the bottom electrodes 95A-B, and may or may not be aligned with any of the electrode contacts 111A-B. In some embodiments, the vias 117A may be located on an opposite side of the capacitor structure 120 from the vias 117B to reduce the risk of voltage breakdown and/or increase the breakdown voltage of the device. Other arrangements are possible.

The electrodes 116A-B and vias 117A-B in the dielectric layers 115 may be formed using a suitable process, such as a damascene process, a dual damascene process, or another process. The electrodes 116A-B and corresponding vias 117A-B in a dielectric layer 115 may be formed using separate deposition steps or the same deposition step. The electrodes 116A-B or vias 117A-B may be formed of similar materials as the electrodes 116A'-B', and may be formed using similar techniques. Each dielectric layer 115 may be formed of one or more layers of materials, and may comprise an etch stop layer in some embodiments. The materials of the dielectric layers 115 may comprise materials similar to those described for the dielectric layer 114 or the second ILD 108, or may comprise different materials.

FIG. 27 shows a three-dimensional view of a capacitor structure 120, in accordance with some embodiments. The capacitor structure 120 shown in FIG. 27 is similar to the capacitor structure 120 shown in FIGS. 25 and 26A-B. Some features have been omitted from FIG. 27 for clarity. The capacitor structure 120 shown in FIG. 27 includes a first capacitor electrode 121A comprising a bottom electrode 95A, multiple electrode contacts 111A, an electrode 116A', and multiple electrodes 116A connected by multiple vias 117A and includes a second capacitor electrode 121B comprising a bottom electrode 95B, multiple electrode contacts 111B, an electrode 116B', and multiple electrodes 116B connected by multiple vias 117B. The capacitor structure 120 shown in FIG. 27 is an example, and in other embodiments a capacitor structure 120 may have a different arrangement or number of features or the features may have different sizes or shapes. For example, the number or arrangement of electrode contacts 111A-B or vias 117A-B may be different than shown. As another example, the number of pairs of electrodes 116A-B may also be different than shown. In other embodiments, a capacitor structure 120 may comprise zero, one, or more than two pairs of electrodes 116A-B formed in dielectric layers 115 over the electrodes 116A'-B'. In this manner, the capacitance of the capacitor structure 120 may be controlled by controlling the number of sets of electrodes 116A-B formed over the electrodes 116A'-B'.

Figure 28:
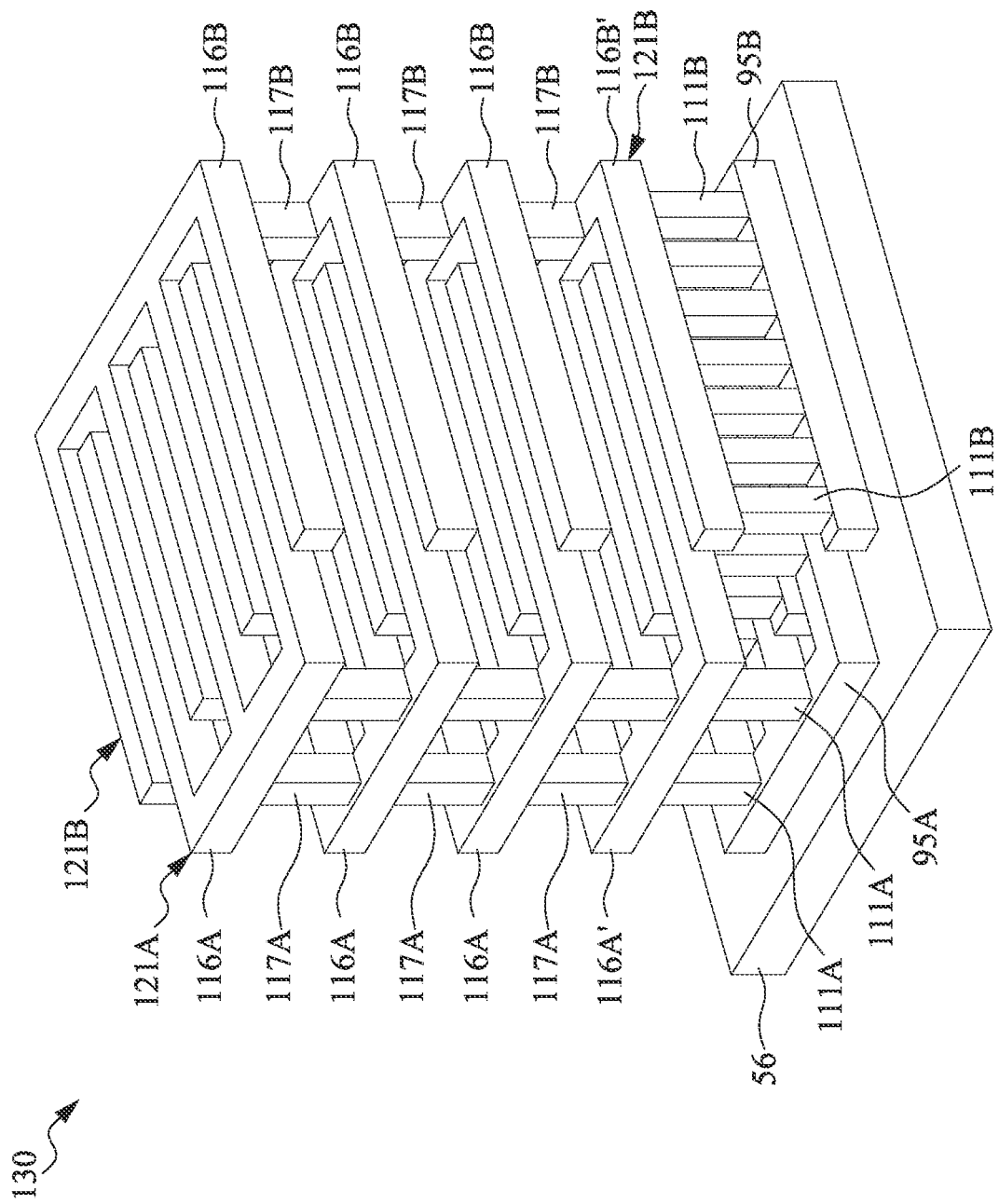
FIG. 28 illustrates an example of an interdigitated capacitor structure in a three-dimensional view, in accordance with some embodiments.
Figure 29:
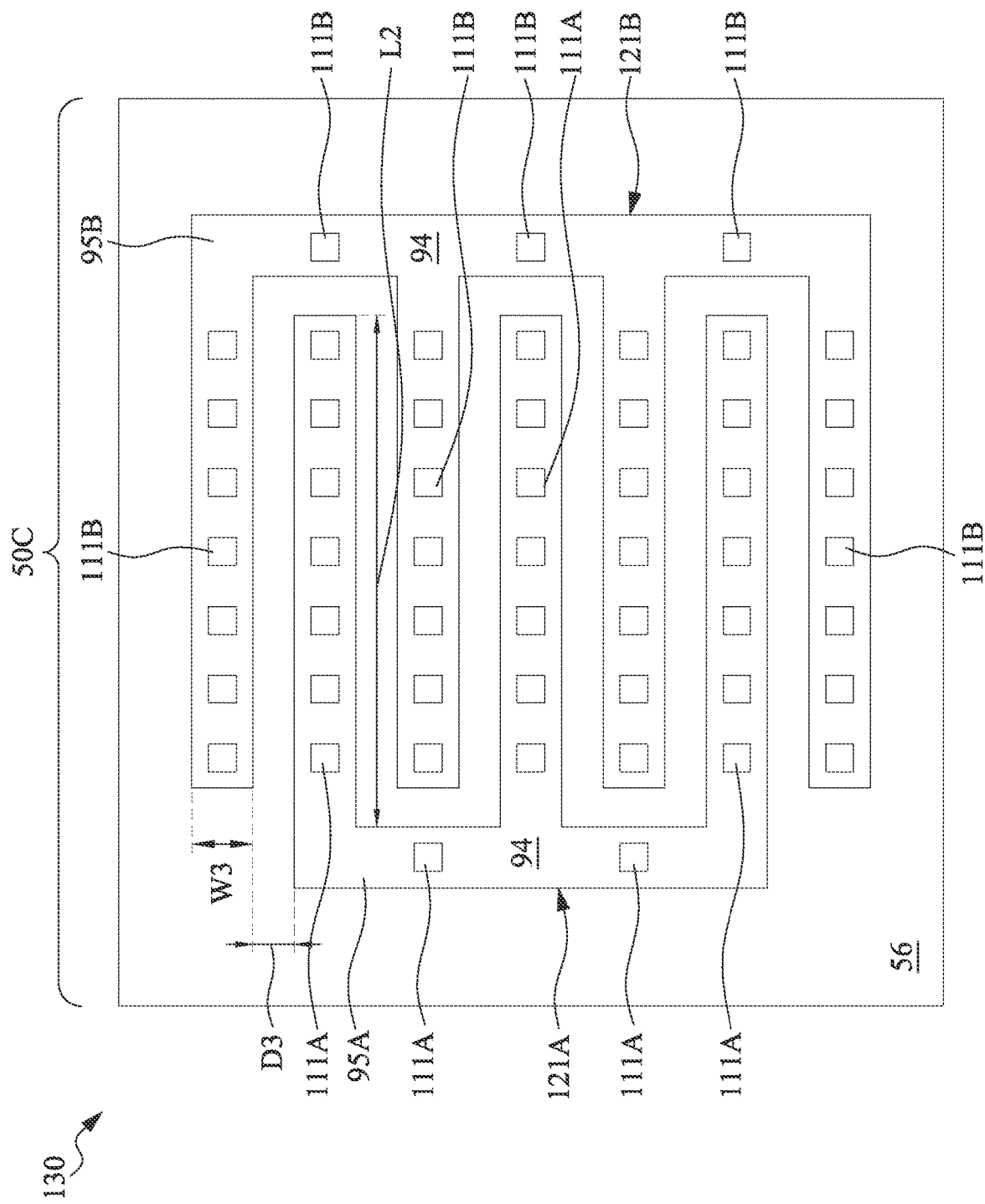

As stated previously, the capacitor electrodes 121A-B may have different shapes or arrangements than shown for the capacitor structure 120 of FIGS. 25-27. As an example, FIGS. 28-30 illustrate a capacitor structure 130 having capacitor electrodes 121A-B with interdigitated "fingers," in accordance with some embodiments. In some cases, the capacitor structure 130 may be considered a Finger Metal-Oxide-Metal (FMOM) capacitor. FIG. 28 illustrates a three-dimensional view of the capacitor structure 130, FIG. 29 illustrates a plan view through the electrode contacts 111A-B, and FIG. 30 illustrates a plan view through the topmost electrodes 116A-B. For clarity, some features are not shown in FIGS. 28-30. The capacitor structure 130 shown in FIGS. 28-30 has a first capacitor electrode 121A with three fingers and a second capacitor electrode 121B with four fingers, but capacitor electrodes 121A-B may have more or fewer fingers or may have the same number of fingers in other embodiments. In some embodiments, the fingers of one level may be oriented in a different direction (e.g., perpendicularly) to the fingers of another level. The fingers of the capacitor electrodes 121A-B may have a different arrangement or orientation than shown, and all suitable variations are considered within the scope of the present disclosure.

Referring to FIG. 29, the bottom electrodes 95A-B and the capacitor electrodes 121A-B of the capacitor structure 130 are shown, in accordance with some embodiments. Similar to the capacitor structure 120, the bottom electrodes 95A-B may be formed simultaneously with gate stacks 97 (not shown). The capacitance between the bottom electrodes 95A-B and between the electrode contacts 111A-B increase the overall capacitance of the capacitor structure 130. The arrangement of electrode contacts 111A-B shown is an example, and electrode contacts 111A-B may have a different arrangement than shown. In some embodiments, the fingers of the capacitor electrodes 121A-B may have a length L2 that is in the range of about 100 nm to about 10,000 nm or may have a width W3 that is in the range of about 10 nm to about 100 nm. In some embodiments, the separation distance D3 between the capacitor electrodes 121A-B is in the range of about 10 nm to about 1000 nm. Other lengths, widths, or distances are possible.

Figures 31A, 31B:
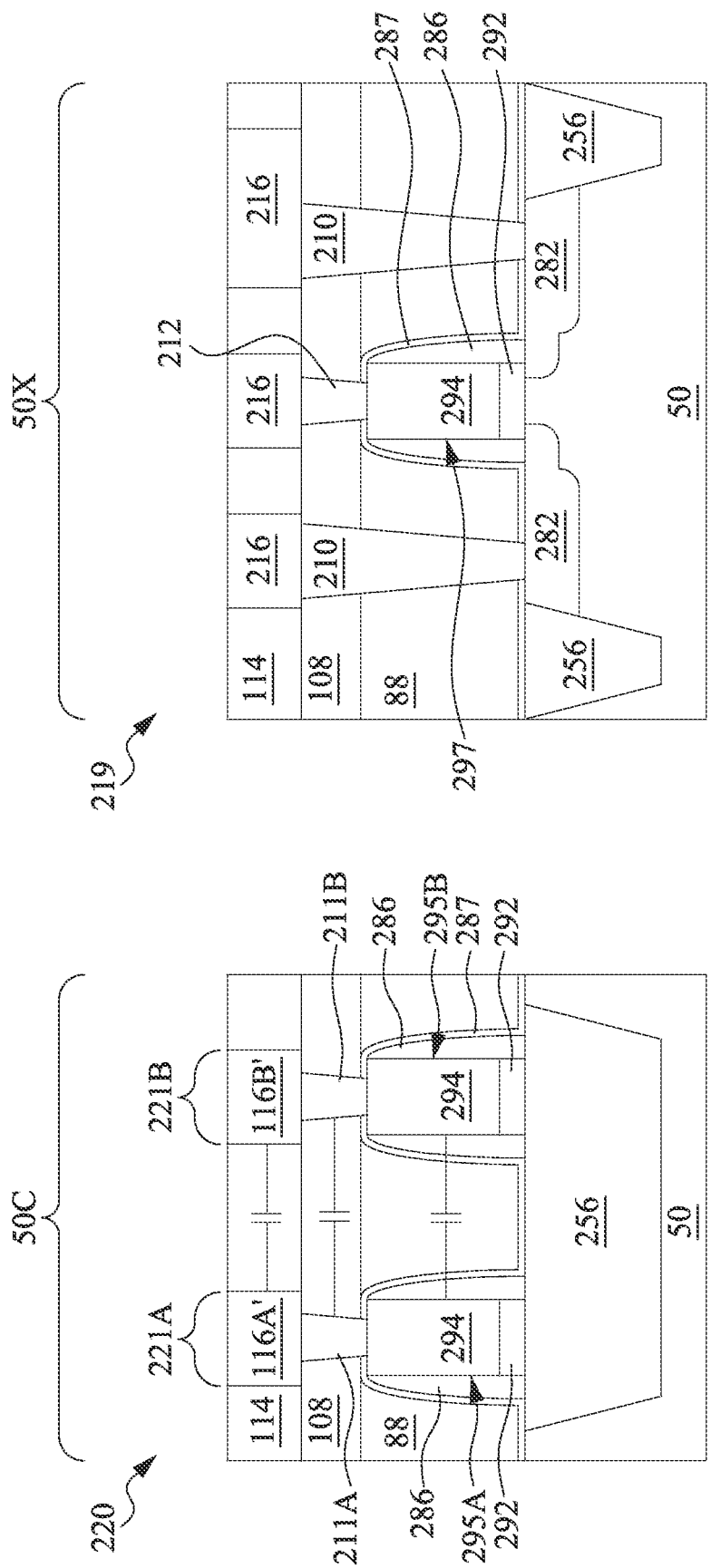
FIGS. 31A and 31B are cross-sectional views of intermediate stages in the manufacturing of a capacitor structure and a planar transistor structure, in accordance with some embodiments.

FIGS. 1 through 26B illustrate an embodiment in which FinFET structures 119 are formed in the transistor region 50X, but other transistor structures may be formed in the transistor region 50X in other embodiments. As an example, FIGS. 31A-31B show an embodiment in which a capacitor structure 220 is formed in the capacitor region 50C and a planar transistor 219 is formed in the transistor region 50X. FIGS. 31A-31B are cross-sectional views, with FIG. 31A illustrated along cross-section B-B and FIG. 31B illustrated along a cross-section similar to cross-section D-D. Some features of the structures shown in FIGS. 31A-31B are similar to those described for FIGS. 1-26B and not all details of all features are repeated. The planar transistor 219 may be n-type or p-type, and the capacitor structure 220 may include features formed using n-type processes and/or p-type processes. Similar to the capacitor electrodes 121A-B of the capacitor structures 120 or 130, the capacitor structure 220 includes capacitor electrodes 221A-B that include bottom electrodes 295A-B, electrode contacts 211A-B, electrodes 116A'-B', and which may include electrodes 116A-B (not shown). The bottom electrodes 295A-B and electrode contacts 211A-B are formed to provide additional capacitance for the capacitor structure 220. The embodiment shown in FIGS. 31A-31B is an example, and other capacitor structures 220 or planar transistors 219 are possible.

In some embodiments, the planar transistor 219 includes STI regions 256 formed in a transistor region 50X of a substrate 50. The planar transistor 219 includes a gate stack 297, which includes a gate dielectric layer 292 formed over the substrate 50 and gate electrode layers 294 formed over the gate dielectric layer 292, in some embodiments. Gate spacers 286 may be formed along sidewalls of the gate stack 297, and an etch stop layer 287 may be formed over the gate spacers 286, gate stack 297, substrate 50, and STI regions 256. Source/drain regions 282 may be formed in the substrate 50 using, for example, one or more implantation processes.

In some embodiments, the capacitor structure 220 is formed on a STI region 256 in a capacitor region 50C of the substrate 50, but in other embodiments the capacitor structure 220 is formed on the substrate 50. The bottom electrodes 295A-B are formed using the same processes that form the gate stacks 297 of the planar transistor 219, in some embodiments. For example, the gate dielectric layer 292 may be formed in the capacitor region 50C and the gate electrode layers 294 may be formed on the gate dielectric layer 292 in the capacitor region 50C. The bottom electrodes 295A-B of the capacitor structure 220 are formed from the gate electrode layers 294, similar to the bottom electrodes 95A-B of the capacitor structure 120 being formed from the gate electrode layers 94 as described previously.

A first ILD 88 and a second ILD 108 may be formed over the etch stop layer 287. In the capacitor region 50C, electrode contacts 211A-B may extend through the second ILD 108 to physically and electrically couple the bottom electrodes 295A-B. In the transistor region 50X, source/drain contacts 210 may extend through the first ILD 88 and the second ILD 108 to physically and electrically couple the source/drain regions 282, and gate contacts 212 may extend through the second ILD 108 to physically and electrically couple the gate stack 297. The electrode contacts 211A-B, the source/drain contacts 210, and/or the gate contacts 212 may be formed using the same process, in some embodiments. Electrodes 116A'-B' may be formed on the electrode contacts 211A-B in a dielectric layer 114 in the capacitor region 50C, and conductive lines 216 may be formed in the dielectric layer 114 in the transistor region 50X. The electrodes 116A'-B' may be formed using the same process that forms the conductive lines 216, in some embodiments. Subsequently, sets of electrodes 116A-B and vias 117A-B (not shown) may be formed on the electrodes 116A'-B', similar to the features shown in FIGS. 26A-B. In this manner, a capacitor structure 220 may be formed in a capacitor region 50C and a planar transistor 219 may be formed in a transistor region 50X.

The embodiments described here have some advantages. The techniques described herein allow for increasing the capacitance of a capacitor structure without the use of additional process steps or masks. The techniques include forming bottom electrodes of the capacitor structure in the same device layer as the gate stack of a transistor, and electrode contacts formed in the same device layer as contacts of the transistor. The bottom electrodes and the electrode contacts can act as additional parallel capacitors of the capacitor structure. Accordingly, the capacitance of the capacitor structure may be increased without increasing the area of the capacitor structure or the vertical height of the capacitor structure above the substrate. This can reduce the manufacturing cost of forming a capacitor structure. The techniques described herein may be fully compatible with Back End of Line (BEOL) processing or various process technologies for forming different types of transistors, such as CMOS process technologies, FinFET process technologies, or the like. The capacitance of the capacitor structure may be tuned by controlling the configuration (e.g., size, shape, separation distance, or the like) of the bottom electrodes and/or the electrode contacts.

In accordance with an embodiment of the present disclosure, a device includes a first dielectric layer over a semiconductor substrate; a second dielectric layer over the first dielectric layer; a transistor over a first region of the semiconductor substrate, wherein the transistor includes a gate stack in the first dielectric layer, wherein the gate stack includes a layer of gate dielectric material and a layer of gate electrode material; and a gate contact in the second dielectric layer, wherein the gate contact is connected to the gate stack, wherein the gate contact includes a gate contact material; and a capacitor structure over a second region of the semiconductor substrate, wherein the capacitor structure includes a first electrode and a second electrode in the first dielectric layer, wherein the first electrode and the second electrode include the gate electrode material; first electrode contacts in the second dielectric layer, wherein the first electrode contacts are over the first electrode and connected to the first electrode, wherein the first electrode contacts include the gate contact material; and second electrode contacts in the second dielectric layer, wherein the second electrode contacts are over the second electrode and connected to the second electrode, wherein the second electrode contacts include the gate contact material, wherein each first electrode contact on the first electrode is adjacent to at least one corresponding second electrode contact on the second electrode. In an embodiment, the capacitor structure further includes a third electrode over and connected to the first electrode contacts and a fourth electrode over and connected to the second electrode contacts. In an embodiment, the third electrode has the same shape as the first electrode, and the fourth electrode has the same shape as the second electrode. In an embodiment, the capacitor structure is on an isolation region in the semiconductor substrate. In an embodiment, the gate electrode material is different from the gate contact material. In an embodiment, the capacitor structure further includes gate dielectric material on the first electrode and on the second electrode. In an embodiment, the transistor is a Fin Field-Effect Transistor (FinFET). In an embodiment, the transistor is n-type.

In accordance with an embodiment of the present disclosure, a semiconductor device includes a substrate; a first device over the substrate, wherein the first device includes a gate stack including a gate electrode material; a source/drain region in the substrate adjacent the gate stack; a first isolation region surrounding the gate stack; a gate contact over and contacting the gate stack, wherein the gate contact includes a gate contact material; and a second isolation region surrounding the gate contact; and a second device over the substrate, wherein the second device includes a first parallel capacitor including first electrodes, wherein the first electrodes include the gate electrode material, wherein the first isolation region separates the first electrodes; and a second parallel capacitor over the first parallel capacitor, wherein the second parallel capacitor includes second electrodes connected to the first electrodes, wherein the second electrodes include the gate contact material, wherein adjacent second electrodes are separated by the second isolation region. In an embodiment, the first electrodes have interdigitated fingers. In an embodiment, each first electrode is connected to respective second electrodes. In an embodiment, the semiconductor device includes a third parallel capacitor over the second parallel capacitor, wherein the third parallel capacitor includes third electrodes connected to the second electrodes, wherein each third electrode is connected to respective second electrodes. In an embodiment, the first device is a planar transistor. In an embodiment, top surfaces of the second isolation region, the second electrodes, and the gate contact are level. In an embodiment, the semiconductor device includes a first spacer along a sidewall of the gate stack and a second spacer along a sidewall of a first electrode, wherein the first spacer and the second spacer are the same material. In an embodiment, the first parallel capacitor and the second parallel capacitor together provide between 7.5% to 15% of the total capacitance of the second device.

In accordance with an embodiment of the present disclosure, a method of forming a capacitor structure includes depositing a dummy gate material over a semiconductor substrate; patterning the dummy gate material to form dummy electrodes; forming spacers along sidewalls of the dummy electrodes; depositing an isolation material over the dummy electrodes and between the dummy electrodes; removing the dummy gate material to form recesses; depositing a gate dielectric material in the recesses; and forming first electrodes of the capacitor structure, which includes depositing a gate electrode material on the gate dielectric material within the recesses. In an embodiment, the semiconductor substrate includes a fin, and wherein the gate dielectric material and the gate electrode material are deposited over the fin to form a gate stack of a transistor structure. In an embodiment, the method includes forming second electrodes on the first electrodes, wherein forming the second electrodes includes depositing a first dielectric material over the first electrodes; patterning first openings in the first dielectric material that expose the first electrodes; and filling the first openings with a first conductive material. In an embodiment, the method includes forming third electrodes on the second electrodes, wherein forming the third electrodes includes depositing a second dielectric material over the second electrodes; patterning second openings in the second dielectric material that expose the second electrodes; and filling the second openings with a second conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first dielectric layer over a semiconductor substrate;
a second dielectric layer over the first dielectric layer;
a transistor over a first region of the semiconductor substrate, wherein the transistor comprises:
a gate stack in the first dielectric layer, wherein the gate stack comprises a layer of gate dielectric material and a layer of gate electrode material; and
a gate contact in the second dielectric layer, wherein the gate contact physically contacts a top surface of the gate stack, wherein the gate contact comprises a gate contact material; and
a capacitor structure over a second region of the semiconductor substrate, wherein the capacitor structure comprises:
a first electrode and a second electrode in the first dielectric layer, wherein the first electrode and the second electrode comprise the gate electrode material;
a plurality of first electrode contacts in the second dielectric layer, wherein the first electrode contacts physically contact a top surface of the first electrode, wherein the first electrode contacts comprise the gate contact material; and
a plurality of second electrode contacts in the second dielectric layer, wherein the second electrode contacts physically contact a top surface of the second electrode, wherein the second electrode contacts comprise the gate contact material, wherein each first electrode contact on the first electrode is adjacent to at least one corresponding second electrode contact on the second electrode, wherein a second electrode contact corresponding to a first electrode contact is a second electrode contact that is closest to that first electrode contact.

2. The device of claim 1, wherein the capacitor structure further comprises a third electrode over and connected to the plurality of first electrode contacts and a fourth electrode over and connected to the plurality of second electrode contacts.

3. The device of claim 2, wherein the third electrode has the same shape as the first electrode, and the fourth electrode has the same shape as the second electrode.

4. The device of claim 1, wherein the capacitor structure is on an isolation region in the semiconductor substrate.

5. The device of claim 1, wherein the gate electrode material is different from the gate contact material.

6. The device of claim 1, wherein the capacitor structure further comprises gate dielectric material on the first electrode and on the second electrode.

7. The device of claim 1, wherein the transistor is a Fin Field-Effect Transistor (FinFET).

8. A semiconductor device comprising:
a substrate;
a first device over the substrate, wherein the first device comprises:
a gate stack comprising a gate electrode material;
a source/drain region in the substrate adjacent the gate stack;
a first isolation region laterally surrounding the gate stack, wherein the first isolation region extends over the substrate and along a sidewall of the gate stack;
a gate contact over and physically contacting the gate stack, wherein the gate contact comprises a first conductive material; and
a second isolation region laterally surrounding the gate contact; and
a second device over the substrate, wherein the second device comprises:
a first parallel capacitor comprising first electrodes, wherein the first electrodes comprise the gate electrode material, wherein the first isolation region laterally separates the first electrodes; and
a second parallel capacitor on the first parallel capacitor, wherein the second parallel capacitor comprises second electrodes physically connected to the first electrodes, wherein the second electrodes comprise the first conductive material, wherein adjacent second electrodes are laterally separated by the second isolation region, wherein at least one second electrode that is on one first electrode is linearly between two second electrodes that are on another first electrode.

9. The semiconductor device of claim 8, wherein the first electrodes have interdigitated fingers.

10. The semiconductor device of claim 8, wherein each first electrode is connected to a respective plurality of second electrodes.

11. The semiconductor device of claim 8 further comprising a third parallel capacitor over the second parallel capacitor, wherein the third parallel capacitor comprises third electrodes connected to the second electrodes, wherein each third electrode is connected to a respective plurality of second electrodes.

12. The semiconductor device of claim 8, wherein the first device is a planar transistor.

13. The semiconductor device of claim 8, wherein top surfaces of the second isolation region, the second electrodes, and the gate contact are level.

14. The semiconductor device of claim 8 further comprising a first spacer along a sidewall of the gate stack and a second spacer along a sidewall of the first electrode, wherein the first spacer and the second spacer are the same material.

15. The semiconductor device of claim 8, wherein the first parallel capacitor and the second parallel capacitor together provide between 7.5% to 15% of the total capacitance of the second device.

16. A method of forming a capacitor structure, the method comprising:
depositing a dummy gate material over a semiconductor substrate;
patterning the dummy gate material to form dummy electrodes;
forming spacers along sidewalls of the dummy electrodes;
depositing an isolation material over the dummy electrodes and between the dummy electrodes;
removing the dummy gate material to form recesses;
depositing a gate dielectric material in the recesses;
forming a first electrode and a second electrode of the capacitor structure, comprising depositing a gate electrode material on the gate dielectric material within the recesses; and
forming third electrodes on the first electrode and fourth electrodes on the second electrode, comprising depositing a first conductive material directly on the first electrode and the second electrode, wherein each third electrode on the first electrode is laterally adjacent to at least one fourth electrode on the second electrode.

17. The method of claim 16, wherein the semiconductor substrate comprises a fin, and wherein the gate dielectric material and the gate electrode material are deposited over the fin to form a gate stack of a transistor structure.

18. The method of claim 16, wherein forming the third electrodes further comprises:
depositing a first dielectric material over the first electrode and the second electrode;
patterning first openings in the first dielectric material that expose the first electrode and the second electrode; and
filling the first openings with the first conductive material.

19. The method of claim 18 further comprising forming a fifth electrode on the third electrodes, wherein forming the fifth electrode comprises:
depositing a second dielectric material over the third electrodes;
patterning second openings in the second dielectric material that expose each third electrode; and
filling the second openings with a second conductive material, wherein the second conductive material extends continuously over the third electrodes.

20. The device of claim 1, wherein the plurality of first electrode contacts and the plurality of second electrode contacts are free of the first dielectric layer.

* * * * *